US011889973B2

(12) United States Patent
Lee et al.

(10) Patent No.: US 11,889,973 B2
(45) Date of Patent: Feb. 6, 2024

(54) VACUUM CLEANER

(71) Applicant: LG Electronics Inc., Seoul (KR)

(72) Inventors: Changjun Lee, Seoul (KR); Philjae Hwang, Seoul (KR); Mantae Hwang, Seoul (KR); Jungbae Hwang, Seoul (KR); Eunji Sung, Seoul (KR); Taekgi Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 20 days.

(21) Appl. No.: 17/704,891

(22) Filed: Mar. 25, 2022

(65) Prior Publication Data

US 2022/0211238 A1 Jul. 7, 2022

Related U.S. Application Data

(63) Continuation of application No. 16/328,103, filed as application No. PCT/KR2017/009062 on Aug. 18, 2017, now Pat. No. 11,344,170.

(30) Foreign Application Priority Data

Aug. 25, 2016 (KR) ........................ 10-2016-0108319
Dec. 23, 2016 (KR) ........................ 10-2016-0177827
Dec. 30, 2016 (KR) ........................ 10-2016-0183824

(51) Int. Cl.
*A47L 9/32* (2006.01)
*A47L 5/24* (2006.01)
(Continued)

(52) U.S. Cl.
CPC ................. *A47L 9/322* (2013.01); *A47L 5/24* (2013.01); *A47L 9/122* (2013.01); *A47L 9/1683* (2013.01);
(Continued)

(58) Field of Classification Search
CPC . A47L 9/322; A47L 5/24; A47L 9/122; A47L 9/1683; A47L 9/22; A47L 9/28;
(Continued)

(56) References Cited

U.S. PATENT DOCUMENTS 6,178,094 B1 * 1/2001 Hakozaki ............. H05K 7/1428
361/752
9,585,535 B2 3/2017 Morgan et al.
(Continued)

FOREIGN PATENT DOCUMENTS

CN 1267180 A * 9/2000 ........... A47L 9/1436
CN 101686784 3/2010
(Continued)

OTHER PUBLICATIONS

Chinese Office Action in Chinese Appln. No. 201780052085, dated Jun. 11, 2020, 15 pages (with English translation).
(Continued)

*Primary Examiner* — Marc Carlson
(74) *Attorney, Agent, or Firm* — Fish & Richardson P.C.

(57) ABSTRACT

A vacuum cleaner of the present invention comprises: a main body having a suction motor for generating suction force; a main PCB capable of generating a control command for the suction motor; a handle part capable of accommodating the main body PCB; and a connector provided at the main body, and to which the main PCB is connected in a process of coupling the handle part to the main body. The main PCB includes a plurality of pads and a slit, and the connector includes: a plurality of connecting pins for making contact with the plurality of pads; and a slit insertion protrusion inserted into the slit.

16 Claims, 22 Drawing Sheets

(51) Int. Cl.

| | | |
|---|---|---|
| *A47L 9/28* | (2006.01) | |
| *A47L 9/22* | (2006.01) | |
| *A47L 9/16* | (2006.01) | |
| *H02J 7/00* | (2006.01) | |
| *A47L 9/12* | (2006.01) | |
| *H01R 33/76* | (2006.01) | |
| *H01R 33/955* | (2006.01) | |
| *H05K 1/11* | (2006.01) | |
| *H05K 5/00* | (2006.01) | |
| *H01R 12/70* | (2011.01) | |
| *H01R 12/72* | (2011.01) | |

(52) U.S. Cl.
CPC ............... *A47L 9/22* (2013.01); *A47L 9/28* (2013.01); *A47L 9/2857* (2013.01); *A47L 9/2884* (2013.01); *A47L 9/2894* (2013.01); *H01R 33/7671* (2013.01); *H01R 33/955* (2013.01); *H02J 7/0045* (2013.01); *H05K 1/111* (2013.01); *H05K 5/003* (2013.01); *H05K 5/0069* (2013.01); *H01R 12/7088* (2013.01); *H01R 12/721* (2013.01); *H05K 2201/09027* (2013.01); *H05K 2201/09063* (2013.01); *H05K 2201/10106* (2013.01)

(58) Field of Classification Search
CPC .... A47L 9/2857; A47L 9/2884; A47L 9/2894; H01R 33/7671; H01R 33/955; H01R 12/7088; H01R 12/721; H02J 7/0045; H05K 1/111; H05K 5/003; H05K 5/0069; H05K 2201/09027; H05K 2201/09063; H05K 2201/10106
See application file for complete search history.

(56) References Cited

U.S. PATENT DOCUMENTS

| | | | | |
|---|---|---|---|---|
| 2008/0083601 | A1* | 4/2008 | Elsworthy | B25F 3/00 200/332.2 |
| 2010/0170057 | A1 | 7/2010 | Lee et al. | |
| 2013/0205538 | A1* | 8/2013 | Thompson | A47L 9/2857 15/344 |
| 2013/0298349 | A1* | 11/2013 | Song | A47L 5/24 15/319 |
| 2014/0196245 | A1* | 7/2014 | Liter | A47L 9/2868 15/339 |
| 2015/0265123 | A1* | 9/2015 | Chen | A47L 11/4061 340/679 |
| 2019/0183309 | A1* | 6/2019 | Lee | A47L 9/28 |

FOREIGN PATENT DOCUMENTS

| | | | | | |
|---|---|---|---|---|---|
| CN | 104918527 | | 9/2015 | | |
| CN | 105361816 | | 3/2016 | | |
| CN | 109640770 | A * | 4/2019 | ............... | A47L 5/24 |
| EP | 2811885 | | 12/2014 | | |
| GB | 2308242 | A * | 6/1997 | ......... | H01R 13/4534 |
| JP | H04051780 | | 4/1992 | | |
| JP | H06060082 | | 8/1994 | | |
| JP | H08-024657 | | 3/1996 | | |
| JP | 09019391 | A * | 1/1997 | | |
| JP | H0919391 | | 1/1997 | | |
| JP | 09075281 | A * | 3/1997 | | |
| JP | H0975281 | | 3/1997 | | |
| JP | 2000049475 | | 2/2000 | | |
| JP | 3321269 | | 9/2002 | | |
| JP | 3321269 | B2 * | 9/2002 | | |
| JP | 2008251767 | | 10/2008 | | |
| JP | 2012250291 | | 12/2012 | | |
| JP | 2012250291 | A * | 12/2012 | | |
| JP | 2014200325 | | 10/2014 | | |
| JP | 2014200325 | A * | 10/2014 | ............... | A47L 5/24 |
| KR | 100548038 | | 1/2006 | | |
| KR | 100548038 | B1 * | 1/2006 | | |
| KR | 20100137906 | | 12/2010 | | |
| KR | 20100137906 | A * | 12/2010 | | |
| KR | 10-2014-0123087 | | 10/2014 | | |
| KR | 20160034041 | A * | 3/2016 | | |
| WO | WO2013117900 | | 8/2013 | | |

OTHER PUBLICATIONS

Extended European Search Report in European Application No. 17843894.1, dated Jul. 9, 2019, 7 pages.
Japanese Notice of Allowance in Japanese Appln. No. 2019-506196, dated Jul. 8, 2020, 7 pages (with English translation).
Japanese Office Action in Japanese Appln. No. 2019-506196, dated Mar. 31, 2020, 8 pages (with English translation).
Samtec, "Micro Edge Card," dated Nov. 1, 2012, 3 pages.
Notice of Allowance in Korean Appln. No. 10-2016-0183824, dated May 10, 2023, 6 pages (with English translation).
Office Action in Korean Appln. No. 10-2016-0183824, dated Feb. 27, 2023, 15 pages (with English translation).

* cited by examiner

VACUUM CLEANER

CROSS-REFERENCE TO RELATED APPLICATIONS

This application is a continuation of U.S. application Ser. No. 16/328,103, filed on Feb. 25, 2019, which is a National Stage application under 35 U.S.C. § 371 of International Application No. PCT/KR2017/009062, filed on Aug. 18, 2017, which claims the benefit of Application No. 10-2016-0183824, filed on Dec. 30, 2016 and Application No. 10-2016-0177827, filed on Dec. 23, 2016, and Application No. 10-2016-0108319, filed on Aug. 25, 2016. The disclosures of the prior applications are incorporated by reference in their entirety.

TECHNICAL FIELD

The present invention relates to a cleaner.

BACKGROUND

Cleaners are devices that suctions or washes dusts or foreign substances to be cleaned so as to perform cleaning.

Cleaners may be classified into a manual cleaner that a user moves in person for cleaning and an automatic cleaner that automatically moves for cleaning.

Manual cleaners may fall into, depending on the types, a canister cleaner, an upright cleaner, a handy cleaner, and a stick cleaner.

Meanwhile, in the related art, a handheld vacuum cleaner has been disclosed in Korean Patent No. 10-1127088 (registered on 8 Mar. 2012).

The handheld vacuum cleaner includes a suction pipe, an airflow generator, a cyclone, a power supply, and a handle.

A PCB connected to a suction motor and a battery may be disposed in the handle.

According to the document, however, the airflow generator is disposed over the handle and the power supply is disposed under the handle, so the internal space of the handle is small. Therefore, the structure for installing the PCB is complicated and it is difficult to install the PCB.

SUMMARY

The present invention provides a cleaner which is capable of being reduced in assembling time in a process of connecting a handle part, with which a main PCB is assembled, to a main body including a connecting pin.

Also, the present invention provides a cleaner in which short circuit between pads due to erroneous assembling between a main PCB and a connecting pin is prevented in a state in which a handle part, with which a main PCB is assembled, and a main body including a connecting pin are connected to each other.

Also, the present invention provides a cleaner in which a main PCB is easily installed in a handle.

A cleaner according to one aspect of the present invention includes: a main body including a suction motor configured to generate suction force; a main PCB configured to generate a control command of the suction motor; a handle part configured to accommodate the main PCB; and a connector which is provided in the main body and to which the main PCB is connected while the handle part is coupled to the main body.

The main PCB includes a plurality of pads and a slit, and the connector comprises a plurality of connecting pins contacting the plurality of pads and a slit insertion protrusion inserted into the slit.

The slit may be disposed between two pads adjacent to each other of the plurality of pads.

The connector may include first and second connecting bodies spaced apart from each other, a connecting body configured to connect the first connecting body to the second connecting body, and a PCB receiving space defined between the first connecting body and the second connecting body.

The slit insertion protrusion may be disposed in the PCB receiving space.

The connecting body may connect the first connecting body to a lower portion of the second connecting body, and the main PCB may be accommodated in the PCB receiving space downward from an upper side of the PCB receiving space.

The slit insertion protrusion may protrude from the connecting body to the PCB receiving space.

The slit insertion protrusion may protrude from one of the first connecting body and the second connecting body to the other one.

The slit insertion protrusion may connect the first connecting body to the second connecting body.

The plurality of pads may include first and second pads disposed on a first surface of the main PCB and spaced apart from each other and third and fourth pads disposed on a second surface, which is a surface opposite to the first surface of the main PCB, and spaced apart from each other The slit may be disposed in a region between the first and second pads and a region between the third and fourth pads.

The first and third pads may be disposed to face each other, and the second and fourth pads may be disposed to face each other.

The plurality of connecting pins may include first and second connecting pins provided on the first connecting body and spaced apart from each other and third and fourth connecting pins provided on the second connecting body and spaced apart from each other.

The slit insertion protrusion may be disposed in a region between the first and second connecting pins and a region between the third and fourth connecting pins.

The first and third connecting pins may be disposed to face each other, and the second and fourth connecting pins may be disposed to face each other.

One portion of each of the plurality of connecting pins may be disposed in each of the connecting bodies, and the other portion may protrude from each of the connecting bodies to the PCB receiving space.

Each of the plurality of connecting pins may be an elastically deformable conductor.

The main PCB may include a first PCB and a second PCB, and one of the first PCB and the second PCB may be connected to the connector.

The main PCB may be installed to stand up on the handle part.

According to the proposed invention, since the main PCB includes the slit, and the slit insertion protrusion is formed on the connector, the coupling accuracy between the main PCB and the connector may be improved.

Also, since the connector includes the two connecting bodies, the main PCB is inserted into the PCB receiving space between the two connecting bodies, and the slit insertion protrusion is accommodated in the slit of the main PCB, the additional fixing unit such as the hook for fixing the main PCB to the connector may be unnecessary.

Also, while the handle part is slid with respect to the main body, since the main PCB is connected to the connector, the process of connecting the main PCB to the connector may be unnecessary.

Also, since the pad is provided on each of both surfaces of one PCB constituting the main PCB, and the one PCB is inserted between the two connecting bodies, the signal may be transmitted as long as one pad of the pads on both surfaces of the one PCB is connected to the connecting pin, and thus, the connection accuracy between the main PCB and the connector may be improved.

Also, since the main PCB is divided into the two PCBs and inserted in handle body, the size of the main PCB may be reduced.

Also, in the process of inserting the main PCB assembly into the accommodation space of the handle body in the state in which the two PCBs are connected to the PCB connector, the main PCB assembly may be coupled to the handle body. Therefore, the structure for fixing the two PCBs to each other and the structure for fixing the two PCBs to the handle body may be simplified, and the assembling process of the user may be easy.

DETAILED DESCRIPTION

Figure 1:
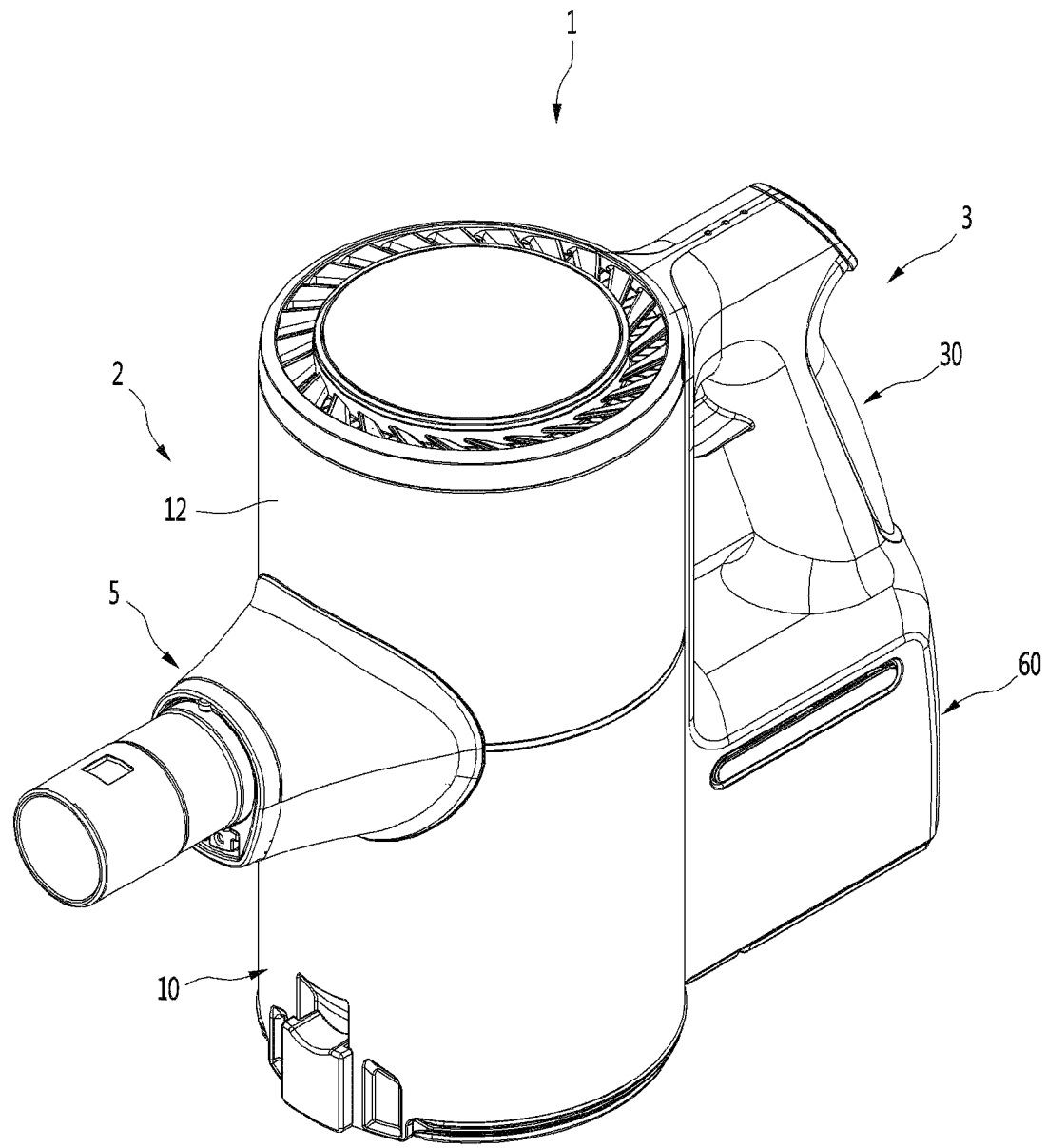
FIG. 1 is a perspective view of a cleaner according to an embodiment of the present invention.

Hereinafter, some embodiments of the present disclosure will be described in detail with reference to the accompanying drawings. It should be noted that when components in the drawings are designated by reference numerals, the same components have the same reference numerals as far as possible even though the components are illustrated in different drawings. Further, in description of embodiments of the present disclosure, when it is determined that detailed descriptions of well-known configurations or functions disturb understanding of the embodiments of the present disclosure, the detailed descriptions will be omitted.

Also, in the description of the embodiments of the present disclosure, the terms such as first, second, A, B, (a) and (b) may be used. Each of the terms is merely used to distinguish the corresponding component from other components, and does not delimit an essence, an order or a sequence of the corresponding component. It should be understood that when one component is "connected", "coupled" or "joined" to another component, the former may be directly connected or jointed to the latter or may be "connected % coupled" or "joined" to the latter with a third component interposed therebetween.

Figure 2:
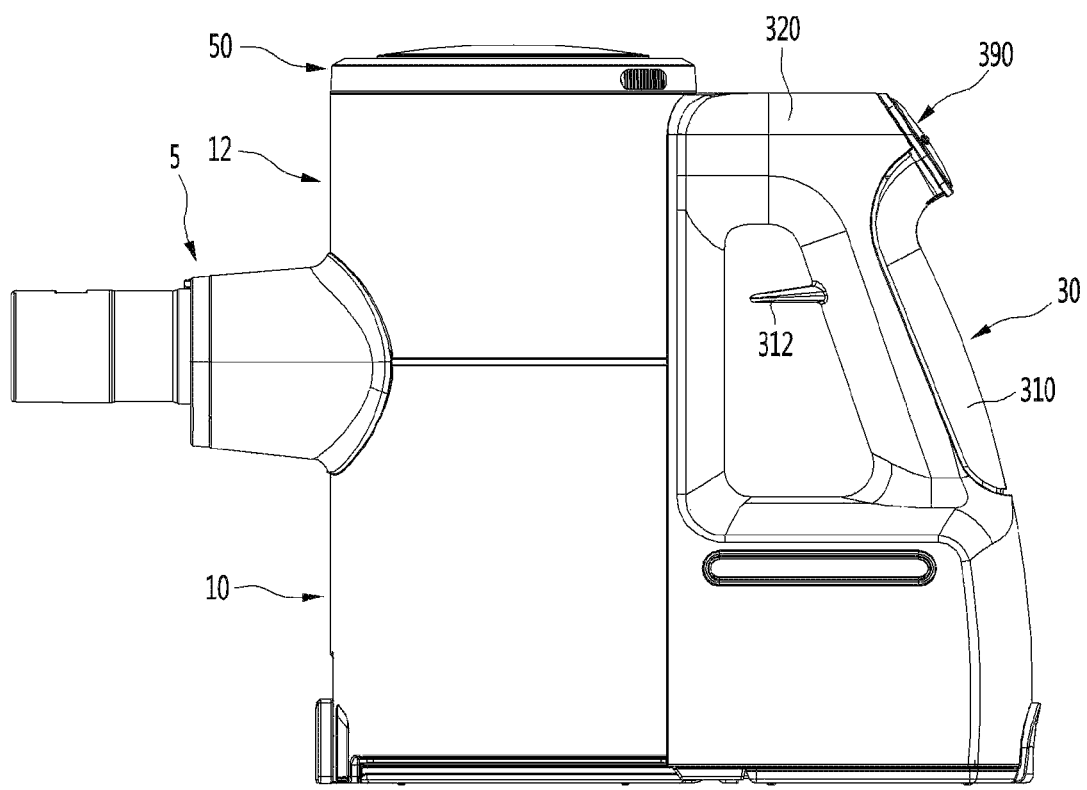
FIG. 2 is a side view of the cleaner according to an embodiment of the present invention.
Figure 3:
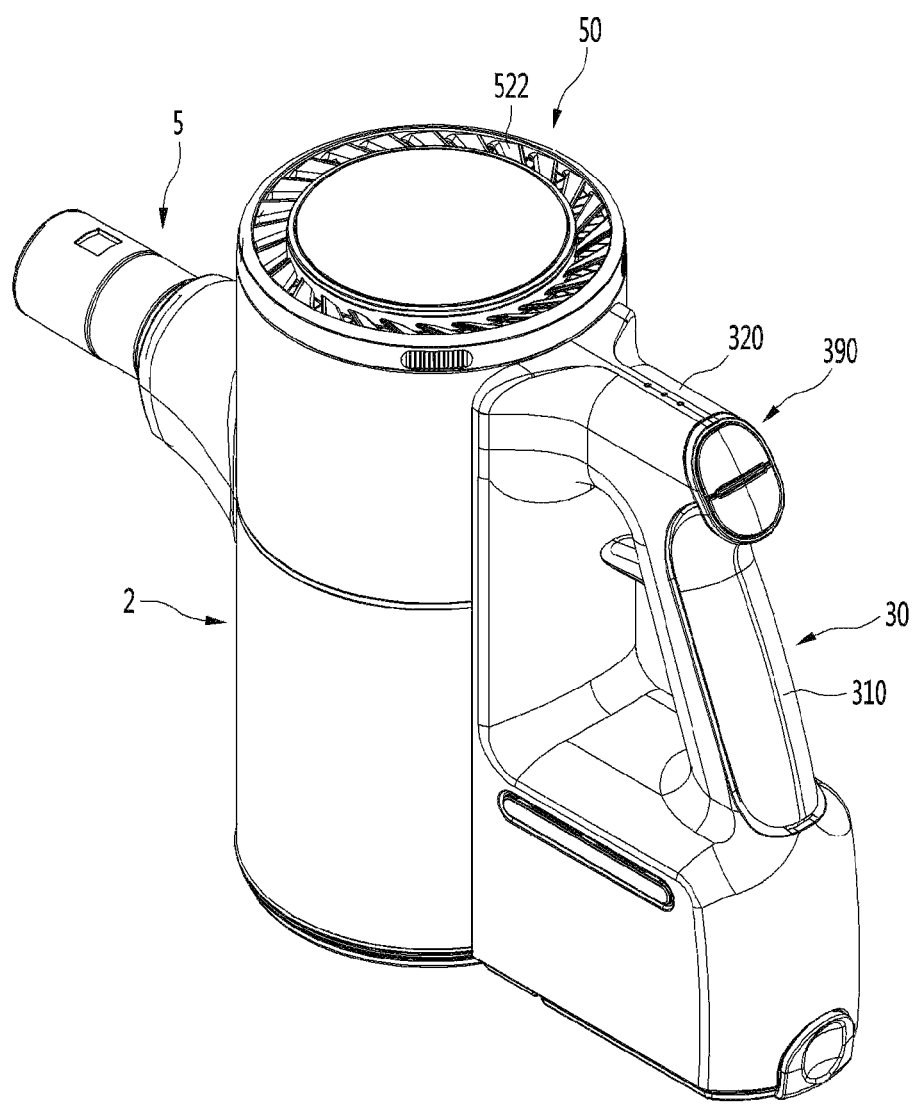
FIG. 3 is a plan view of the cleaner according to an embodiment of the present invention.
Figure 4:
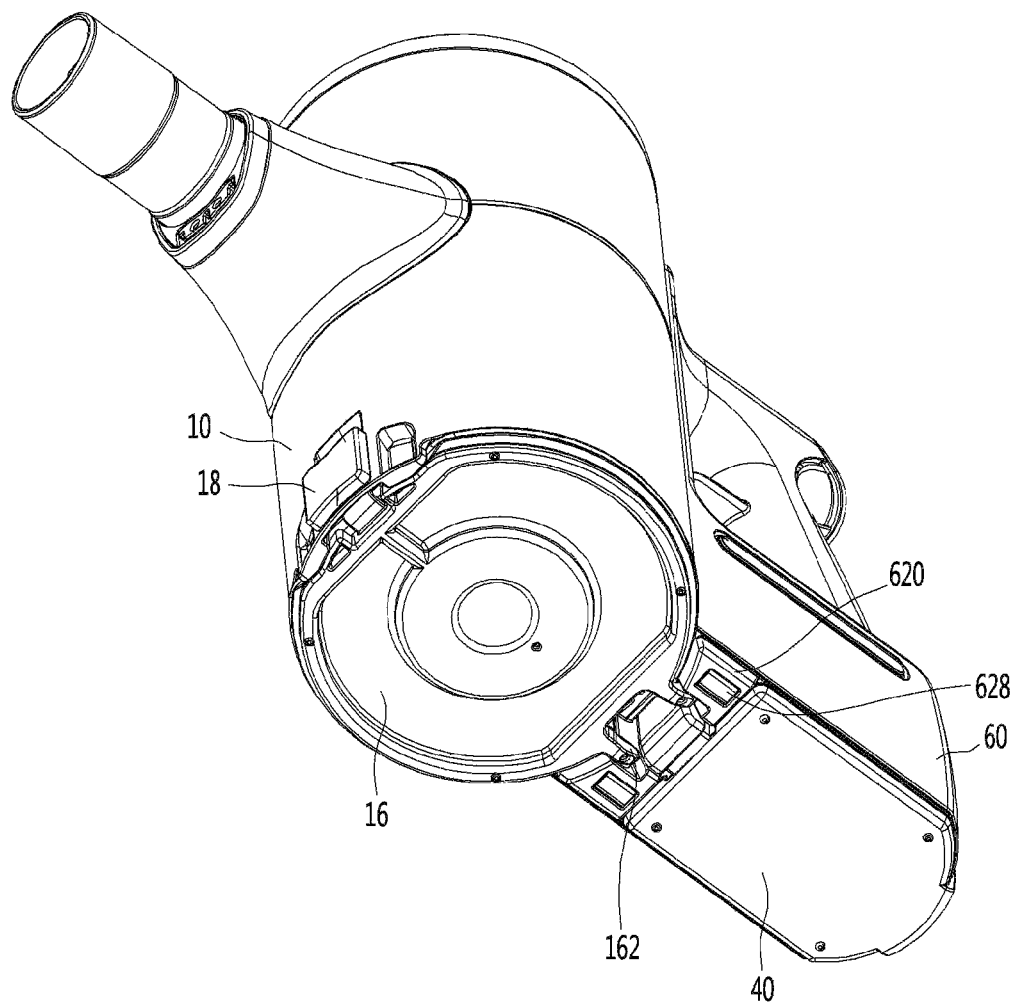
FIG. 4 is a perspective view of the cleaner according to an embodiment of the present invention when seen from under the cleaner.
Figure 5:
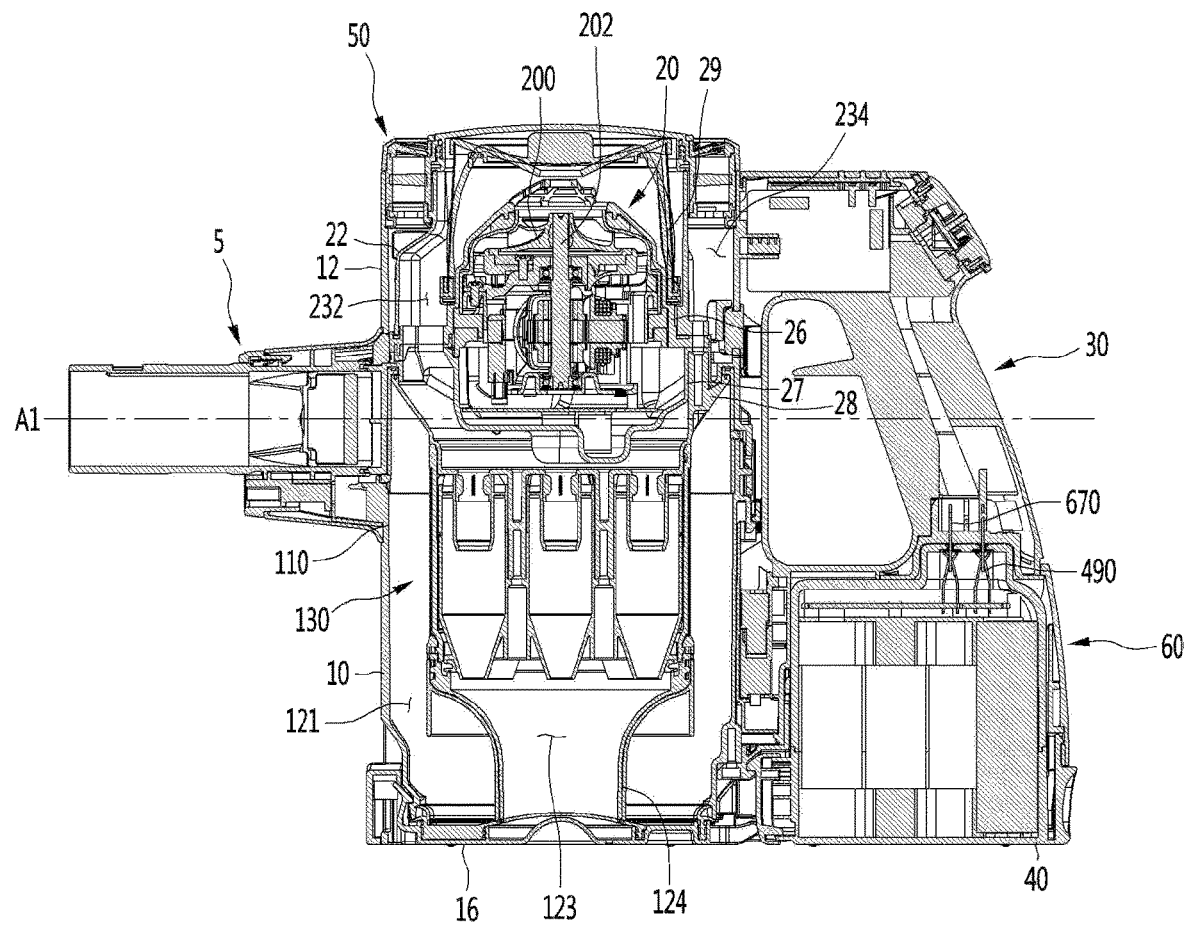
FIG. 5 is a vertical cross-sectional view of the cleaner according to an embodiment of the present invention.

FIG. 1 is a perspective view of a cleaner according to an embodiment of the present invention, FIG. 2 is a side view of the cleaner according to an embodiment of the present invention, FIG. 3 is a plan view of the cleaner according to an embodiment of the present invention, FIG. 4 is a perspective view of the cleaner according to an embodiment of the present invention when seen from under the cleaner, and FIG. 5 is a longitudinal cross-sectional view of the cleaner according to an embodiment of the present invention.

Referring to FIGS. 1 to 5, a cleaner 1 according to an embodiment of the present invention may include a main body 2.

The cleaner 1 may further include a suction unit 5 coupled to the front of the main body 2. The suction unit 5 can guide air containing dust into the main body 2.

The cleaner 1 may further include a handle part 3 coupled to the main body 2. The handle part 3 may be positioned opposite to the suction unit 5 on the main body 2.

That is, the main body 2 may be disposed between the suction unit 5 and the handle part 3.

The main body 2 may include a first body 10 and a second body 12 on the first body 10. The first body 10 and the second body 12 may be directly combined or may be indirectly combined through an intermediate member.

The first body 10 and the second body 12 may be, though not limited thereto, formed in a cylindrical shape.

The first body 10 and the second body 12 are open at the top and the bottom, respectively. That is, the bodies 10 and 12 may have a top opening and a bottom opening, respectively.

The suction unit 5 may be coupled to the main body 2 such that the center of the suction unit 5 is positioned approximately at the boundary between the first body 10 and the second body 12.

The main body 2 may further include a dust separation unit that separates dust from air sucked through the suction unit 5.

The dust separation unit may include a first cyclone unit 180 that can separate dust, for example, using cyclonic flow. The first body 10 includes the first cyclone unit 180 in this configuration.

The air and dust sucked through the suction unit 5 helically flow along the inner side of the first cyclone unit 180.

The axis of the cyclonic flow in the first cyclone unit 110 may vertically extend.

The dust separation unit may further include a second cyclone unit 130 that secondarily separates dust from the air discharged out of the first cyclone unit 110. The second cyclone unit 130 may be disposed inside the first cyclone unit 110 to minimize the size of the dust separation unit. The second cyclone unit 130 may include a plurality of cyclone bodies arranged in a raw.

As another example, the dust separation unit may include one cyclone unit, in which the axis of the cyclonic flow may also vertically extend.

The first body 10 functions as a dust container that stores dust separated by the cyclone units 110 and 130.

The main body 2 may further include a body cover 16 for opening/closing the bottom of the first body 10. The body cover 16 can open/close the first body 10 by being rotated. A button 18 for rotating the body cover 16 may be disposed on the first body 10.

A hinge 162 of the body cover 16 may be coupled to hinge coupling portions 620 of the battery housing 60.

At least a portion of the second cyclone unit 130 may be positioned inside the first body 10.

A dust storage guide 124 that guides the dust separated by the second cyclone unit 130 to be stored may be disposed in the first body 10. The dust storage guide 124 may be coupled to the bottom of the second cyclone unit 130 in contact with the top of the body cover 16.

The dust storage guide 124 may divide the internal space of the first body 10 into a first dust storage part 121 where the dust separated by the first cyclone unit 110 is stored and a second dust storage part 123 where the dust separated by the second cyclone unit 130 is stored.

The internal space of the dust storage guide 124 is the second dust storage part 123 and the space between the dust storage guide 124 and the first body 10 is the first dust storage part 121.

The body cover 16 can open/close both of the first dust storage part 121 and the second dust storage part 123.

The cleaner 1 may further include a suction motor 20 for generating suction force and a battery 40 for supplying power to the suction motor 20.

The suction motor 20 may be disposed in the second body 12. At least a portion of the suction motor 20 may be disposed over the dust separation unit. Accordingly, the suction motor 20 is disposed over the first body 10.

The suction motor 20 may communicate with an outlet of the second cyclone unit 130.

To this end, the main body 2 may further include a discharge guide 28 connected to the second cyclone unit 130 and a flow guide 22 that communicates with the discharge guide 28.

For example, the discharge guide 28 is disposed on the second cyclone unit 130 and the flow guide 22 is disposed over the discharge guide 28.

Further, at least a portion of the suction motor 20 is positioned inside the flow guide 22.

Accordingly, the axis of the cyclonic flow in the first cyclone unit 110 may pass through the suction motor 20.

When the suction motor 20 is disposed over the second cyclone unit 130, the air discharged from the second cyclone unit 130 can flow directly to the suction motor 20, so the channel between the dust separation unit and the suction motor 20 can be minimized.

The suction motor 20 may include a rotary impeller 200. The impeller 200 may be fitted on a shaft 202. The shaft 202 is disposed to extend vertically.

An extension line from the shaft 202 (which may be considered as the rotational axis of the impeller 200) may pass through the first body 10. The rotational axis of the impeller 200 and the axis of the cyclonic flow in the first cyclone unit 180 may be on the same line.

According to the present invention, there is the advantage that the path through which the air discharged from the dust separation unit, that is, the air discharged upward from the second cyclone unit 190 flows to the suction motor 20 can be reduced and a change in direction of air can be decreased, so a loss of airflow can be reduced.

As the loss of airflow is reduced, suction force can be increased and the lifetime of the battery 40 for supplying power to the suction motor 20 can be increased.

The cleaner 1 may further include an upper motor housing 26 covering a portion of the top of the suction motor 20 and a lower motor housing 27 covering a portion of the bottom of the suction motor 20. The suction motor 20 may be disposed inside the motor housing 26 and the flow guide 22 may be disposed to cover the upper motor housing 26.

At least a portion of the flow guide 22 may be spaced apart from the upper motor housing 26. Further, at least a portion of the flow guide 22 may be spaced apart from the second body 12.

Accordingly, a first air passage 232 is defined by the inner side of the flow guide 22 and the outer side of the upper motor housing 26 and a second air passage 234 is defined by the outer side of the flow guide 22 and the inner side of the second body 12.

The air discharged from the second cyclone unit 130 flows to the suction motor 20 through the first air passage 232 and the air discharged from the suction motor 20 flows through the second air passage 234 and is then discharged outside. Accordingly, the second air passage 234 functions as an exhaust channel.

The handle part 3 may include a handle 30 for a user to hold and a battery housing 60 under the handle 30.

The handle 30 may be disposed behind the suction motor 20.

As for directions, with respect to the suction motor 20 in the cleaner 1, the direction in which the suction unit 5 is positioned is the front direction and the direction in which the handle 30 is positioned is the rear direction.

The battery 40 may be disposed behind the first body 10. Accordingly, the suction motor 20 and the battery 40 may be arranged not to vertically overlap each other and may be disposed at different heights.

According to the present invention, since the suction motor 20 that is heavy is disposed ahead of the handle 30 and the battery 40 that is heavy is disposed behind the handle 30, so weight can be uniformly distributed throughout the cleaner 1. It is possible to prevent injuries to the user's wrist when a user cleans with the handle 30 in his/her hand. That is, since the heavy components are distributed at the front and rear portions and at different heights in the cleaner 1, it is possible to prevent the center of gravity of the cleaner 1 from concentrating on any one side.

Since the battery 40 is disposed under the handle 30 and the suction motor 20 is disposed in front of the handle 30, there is no component over the handle 30. That is, the top of the handle 30 forms a portion of the external appearance of the top of the cleaner 1.

Accordingly, it is possible to prevent any component of the cleaner 1 from coming in contact with the user's arm while the user cleans with the handle 30 in his/her hand.

The handle 30 may include a first extension 310 extending vertically to be held by a user and a second extension 320 extending toward the suction motor 20 over the first extension 310. The second extension 320 may at least partially horizontally extend.

In the present invention, the first extension 310, which is a portion that a user can hold (a portion that a user's palm can come in contact with), may be referred to as a grip part.

A stopper 312 for preventing a user's hand holding the first extension 310 from moving in the longitudinal direction of the first extension 310 (vertically in FIG. 2) may be formed on the first extension 310. The stopper 312 may extend toward the suction unit 5 from the first extension 310.

The stopper 312 is spaced apart from the second extension 320. Accordingly, a user is supposed to hold the first extension 310, with some of the fingers over the stopper 312 and the other fingers under the stopper 312.

For example, the stopper 312 may be positioned between the index finger and the middle finger.

According to this arrangement, when a user holds the first extension 310, the longitudinal axis A1 of the suction unit 5 may pass through the user's wrist.

When the longitudinal axis A1 of the suction unit 5 passes through the user's wrist and the user's arm is stretched, the longitudinal axis A1 of the suction unit 5 may be substantially aligned with the user's stretched arm. Accordingly, there is the advantage in this state that the user uses minimum force when pushing or pulling the cleaner 1 with the handle 30 in his/her hand.

The handle 30 may include an operation unit 390. For example, the operation unit 390 may be disposed on an inclined surface of the second extension 320. It is possible to input control command of the suction motor 20 through the operation unit 390. For example, it is possible to input instructions to turn on/off the suction motor through the operation unit 390. Further, it is possible to control the intensity of the suction force of the suction motor 20 that has been turned on through the operation unit 390.

The operation unit 390 may be disposed to face a user. The operation unit 390 may be disposed opposite to the stopper 312 with the handle 30 therebetween.

The operation unit 390 is positioned higher than the stopper 312. Accordingly, a user can easily operate the operation unit 390 with his/her thumb with the first extension 310 in his/her hand.

Further, since the operation unit 390 is positioned outside the first extension 310, it is possible to prevent the operation unit 390 from being unexpectedly operated when a user cleans with the first extension 310 in his/her hand.

The battery housing 60 may be disposed under the first extension 310.

The battery 40 may be detachably accommodated in the battery housing 60.

For example, the battery 40 may be inserted into the battery housing 60 from under the battery housing 60.

The rear side of the battery housing 60 and the rear side of the first extension 310 may form a continuous surface. Accordingly, the battery housing 60 and the first extension 310 can be shown like a single unit.

When the battery 40 is inserted in the battery housing 60, the bottom of the battery 40 may be exposed to the outside.

Accordingly, when the cleaner 1 is placed on the floor, the battery 40 can be in contact with the floor.

According to this structure, there is the advantage that the battery 40 can be directly separated from the battery housing 60.

Further, since the bottom of the battery 40 is exposed to the outside, the bottom of the battery 40 can come in direct contact with the air outside the cleaner 1, so the battery 40 can be more efficiently cooled.

The battery housing 60 may have charging stand connection terminals 628 for charging the battery 40 coupled to the battery housing 60. It is possible to bring the charging stand connection terminals 628 in contact with a terminal of a charging stand (not shown) by placing the cleaner 1 on the charging stand.

The battery housing 60 may have battery connection terminals 670 that are connected to battery terminals 490 in the battery 40 inserted in the battery housing 60. The battery connection terminals 670 may be connected to the battery terminals 490 through the top of the battery 40.

Referring to FIG. 3, the cleaner 1 may further include a filter unit 50 having air exits 522 for discharging the air that has passed through the suction motor 20. For example, the air exits 522 may include a plurality of openings and the openings may be circumferentially arranged. Accordingly, the air exist 522 may be arranged in a ring shape.

The filter unit 50 may be detachably coupled to the top of the main body 2. That is, the filter unit 50 may be detachably coupled to the second body 12.

When the filter unit 50 is coupled to the main body 2, a portion of the filter unit 50 is positioned outside the second body 12. Accordingly, a portion of the filter unit 50 is inserted in the main body 2 through the open top of the main body 2 and the other portion protrudes outside from the main body 2.

The height of the main body 2 may be substantially the same as the height of the handle 30. Accordingly, the filter unit 50 protrudes upward from the main body 2, so a user can easily hold and separate the filter unit 50.

When the filter unit 50 is combined with the main body 2, the air exits 522 are positioned at the upper portion of the filter unit 50. Accordingly, the air discharged from the suction motor 20 is discharged upward from the main body 2.

According to this embodiment, it is possible to prevent the air discharged from the air exits 522 from flowing to a user while the user cleans using the cleaner 1.

The main body 2 may further include a pre-filter 29 for filtering the air flowing into the suction motor 20. The pre-filter 29 may be disposed inside the flow guide 22. Further, the pre-filter 29 is seated over the upper motor housing 16 and may surround a portion of the upper motor housing 26. That is, the upper motor housing 26 may include a filter support for supporting the pre-filter 29.

Figure 6:
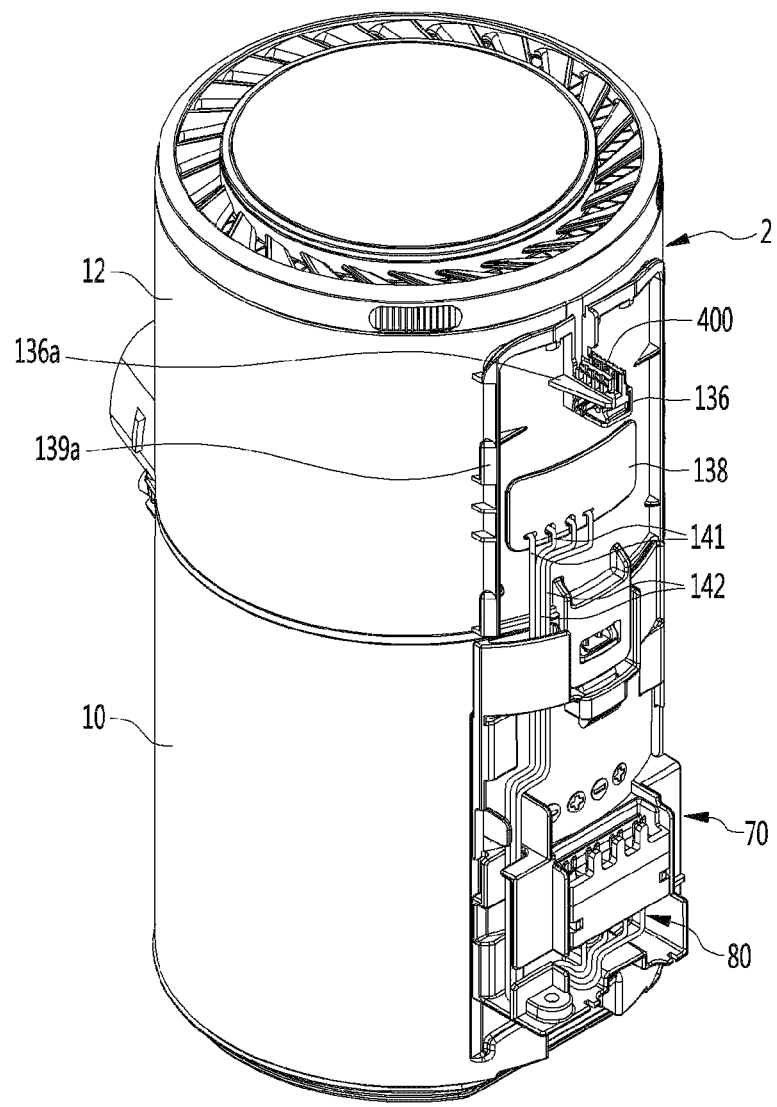
FIG. 6 is a view showing the main body according to an embodiment of the present invention with the handle part separated.
Figure 7:
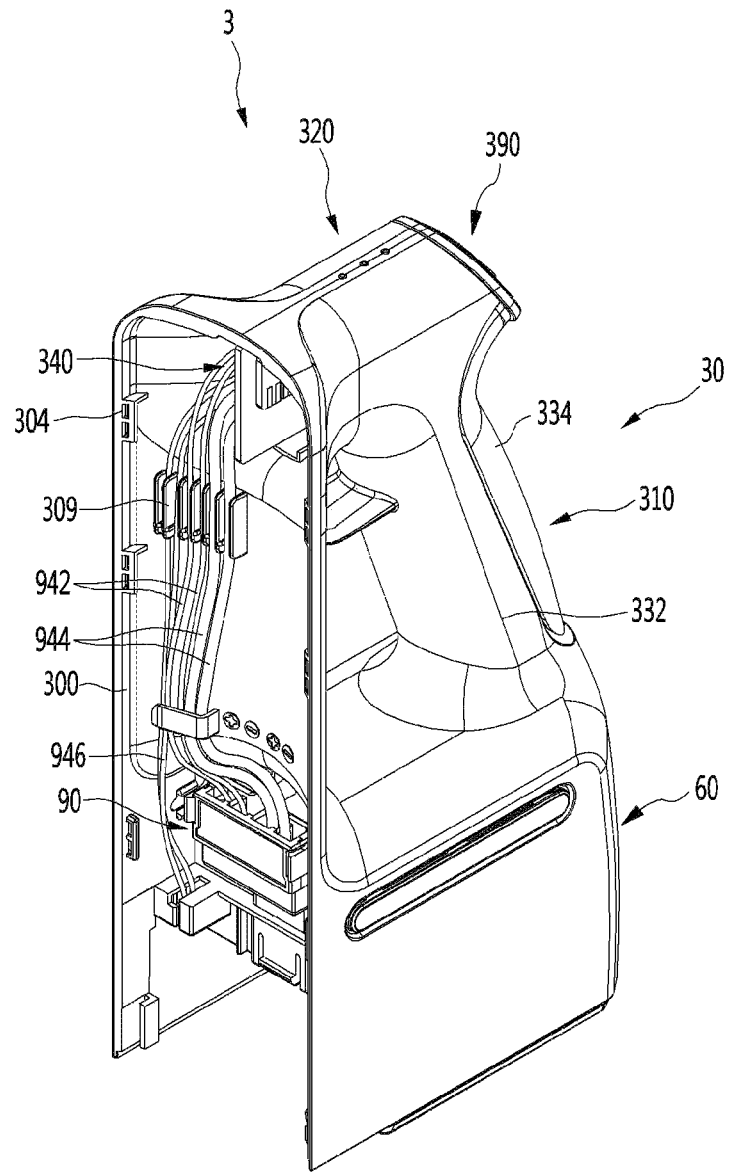
FIG. 7 is a perspective view of the handle part according to an embodiment of the present invention.

FIG. 6 is a view showing the main body according to an embodiment of the present invention with the handle part separated and FIG. 7 is a perspective view of the handle part according to an embodiment of the present invention.

Referring to FIGS. 6 and 7, the handle part 3 may include a handle body 332 and a handle body cover 334 that covers the handle body 332.

The handle body 332 forms a portion of the first extension 310 and a portion of the second extension 320. The handle cover 334 forms the other portion of the first extension 310 and the other portion of the second extension 320.

That is, when the handle cover 334 is coupled to the handle body 332, the handle body 332 and the handle cover 334 form the first extension 310 and the second extension 320.

The handle body 332 may form not only the handle 30, but the battery housing 60.

The handle part 3 may further have a main body coupling portion 70 for coupling the handle part 3 to the main body 2. The handle 30 and the battery housing 60 can be coupled through the main body coupling portion 70.

The handle part 3 may further have a main PCB (Printed Circuit Board) unit 340 for controlling the suction motor 20.

The main PCB unit 340, for example, may be inserted in the internal space of the second extension 320.

The main body 2 may further have a connector support 136 for supporting a connector 400.

The connector 400 may be connected with the suction motor 20 in the main body 2. Further, the connector 400 may be connected with the main PCB unit 340. The connector 400 transmits control signals from the main PCB unit 340 to the suction motor 20. The connector 400 may have a signal terminal for transmitting the control signals.

The main body 2 may further have a stopper rib 136a for preventing the connector 400 supported by the connector support 136 from separating upward.

The stopper rib 136a is spaced from the connector support 136. The connector 400 may be inserted in the space between the connector support 136a and the stopper rib 136a. For example, the connector 400 may be horizontally slid on the connector support 136

The connector support 136 and the stopper rib 136a may be, for example, formed on the second body 12.

The main body 2 may have a main body terminal 80 and the handle part 3 may further have a handle terminal 90. The handle terminal 90 may be connected with the main PCB unit 340.

The main body terminal 80 may be disposed on a cover member 70 coupled to the main body 2. The main body terminal 80 may be connected to the handle terminal 90 when the handle part 3 is coupled to the main body 2.

A plurality of main body wires 141 and 142 may be connected to the main body terminal 80. The main body wires 141 and 142 may be connected to the main body terminal 80 from under the main body terminal 80.

The main body wires 141 and 142 may include a pair of first wires 141 connected to the suction motor 20 to supply power to the suction motor 20 and a pair of second wires 142 connected to the suction unit 5.

The main body wires 141 and 142 may be inserted into the main body 2 through a packing 138 on the main body 2.

According to this embodiment, since a signal terminal for transmitting control signals and a control terminal for supplying power are separated and disposed at different positions, an increase in size of the main body terminal 80 can be prevented.

The handle part 3 may have a body coupling portion 304 for coupling the main body 2 and the main body 2 may have a handle coupling portion 139a for coupling the body coupling portion 304. The handle part 3 may be vertically slide-coupled to the main body 2 by the body coupling portion 304 and the handle coupling portion 139a.

Further, when the handle part 3 is coupled to the main body 2, the PCB unit 340 can be connected with the connector 400 and the handle terminal 90 can be connected with the main body terminal 80.

The handle part 3 may further include a plurality of handle wires 942, 944, and 946. The handle wires 942, 944, and 946 may be connected to the main PCB unit 340.

The main PCB unit 340 may be connected to the battery 40. Further, the main PCB unit 340 may receive operation signals from the operation unit 390. The main PCB unit 340 may supply power to the suction motor 20 and/or a suction unit terminal in the suction unit or control the intensity of the suction force of the suction motor 20 on the basis of the input operation signals.

The handle wires 942, 944, and 946 may include first handle wires 942 connected to the handle terminal 90 to supply power to the suction unit terminal and second handle wires 944 connected to the handle terminal 90 to supply power to the suction motor 20.

When the handle terminal 90 is connected to the main body terminal 80, the first handle wires 942 may be connected to the first main body wires 141 of the main body 2 and the second handle wires 944 may be connected to the second main body wires 142 of the main body 2.

The handle wires 942, 944, and 946 may further have terminal connection wires 946 connected to the cradle connection terminals 628.

The handle part 3 may further have wire guides 309 that guide the handle wires to prevent the handle wires 942, 944, and 946 from getting entangled.

The structure of the main PCB unit 340 and a method of assembling the main PCB unit 340 are described hereafter.

The structure of the main PCB unit is described in detail hereafter.

Figure 8:
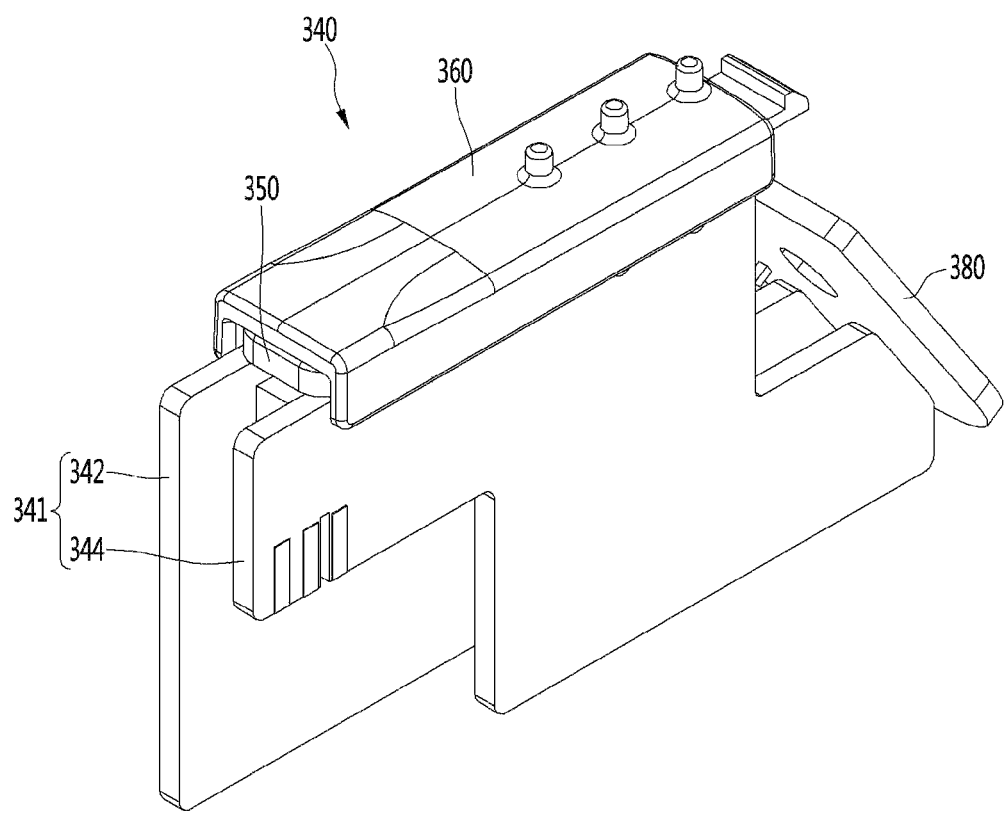
FIG. 8 is a perspective view of a main PCB unit according to an embodiment of the present invention.
Figure 9:
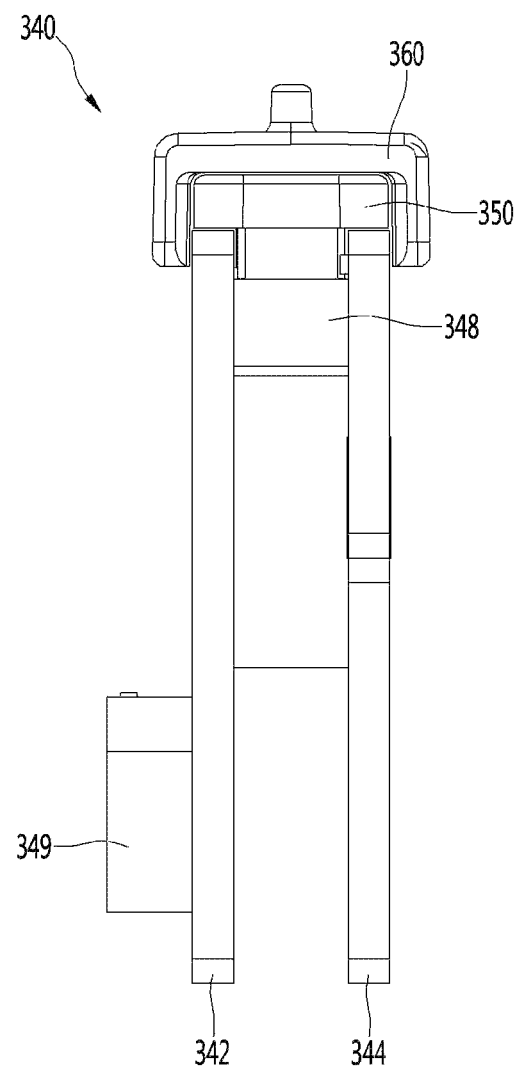
FIG. 9 is a front view of the main PCB unit shown in FIG. 8.
Figure 10:
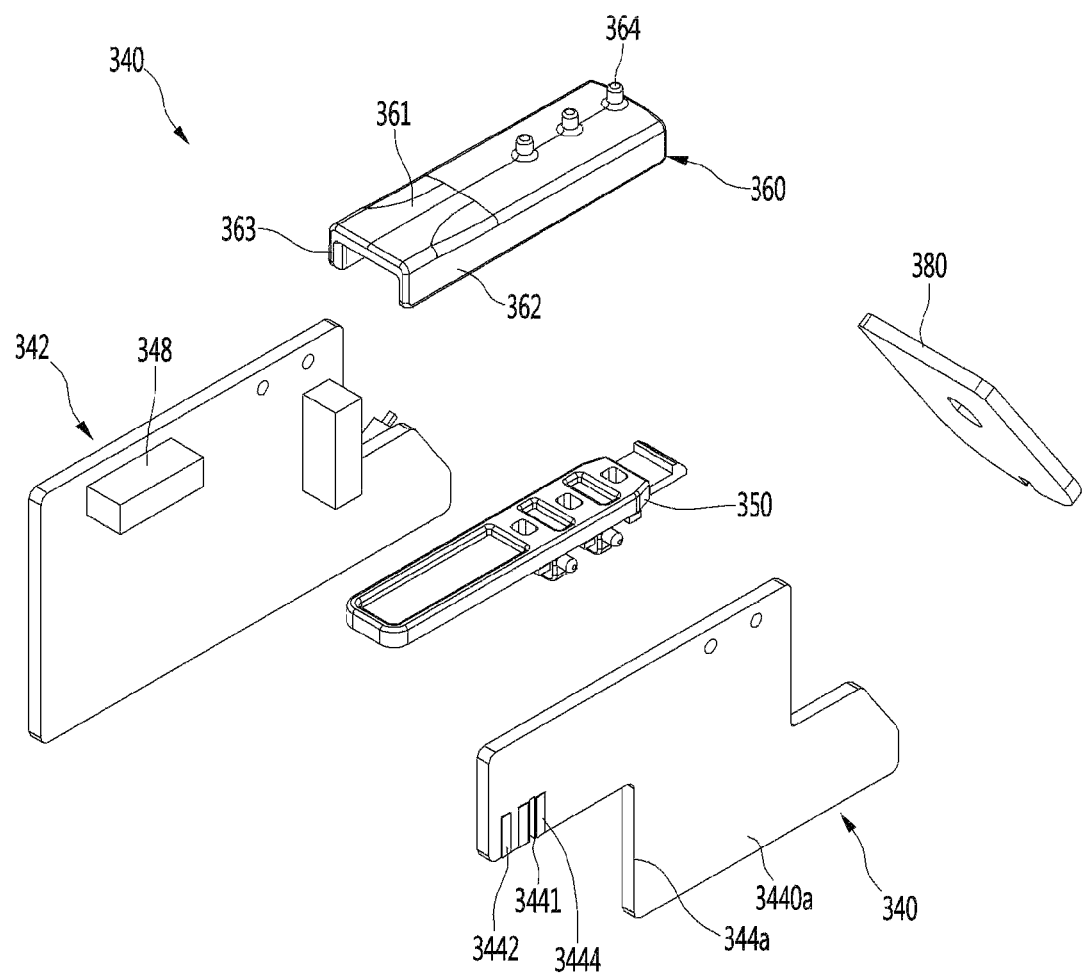
FIGS. 10 and 11 are exploded perspective views of the main PCB unit shown in FIG. 8.
Figure 11:
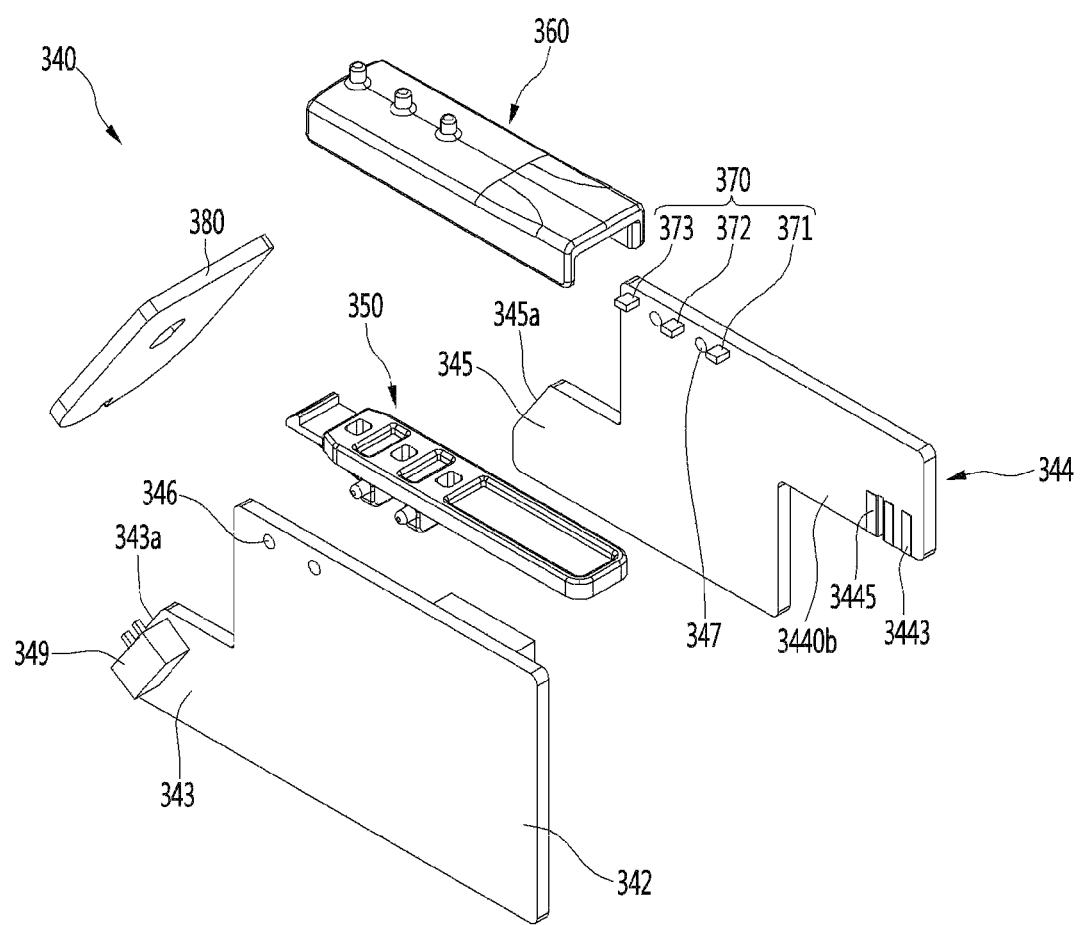
Figure 12:
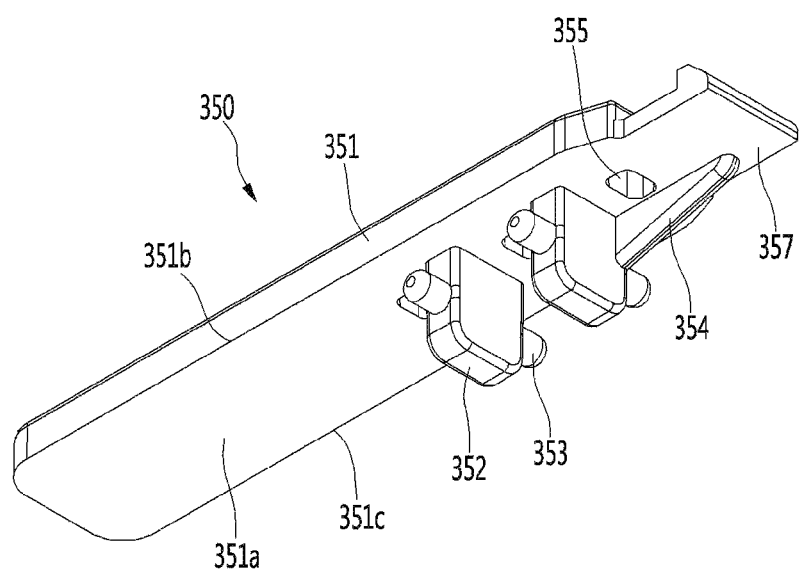
FIG. 12 is a perspective view of a PCB connector of the present invention.

FIG. 8 is a perspective view of the main PCB unit according to an embodiment of the present invention, FIG. 9 is a front view of the main PCB unit shown in FIG. 8, and FIGS. 10 and 11 are exploded perspective views of the main PCB unit shown in FIG. 8. FIG. 12 is a perspective view of a PCB connector of the present invention.

Referring to FIGS. 8 to 12, the main PCB unit 340 according to this embodiment may include a main PCB 341.

The main PCB 341 may be composed of a plurality of separate PCBs to be disposed inside the second extension 320. That is, the main PCB 341 may include a first PCB 342 and a second PCB 344.

The first PCB 342 and the second PCB 344 may be erect in parallel with each other. The first PCB 342 and the second PCB 344 may be horizontally spaced apart from each other.

One or more connection terminals 348 for connecting the first PCB 342 and the second PCB 344 may be disposed between the PCBs.

The main PCB unit 340 may further include a PCB connector 350 for connecting the first PCB 342 and the second PCB 344 to each other.

The PCB connector 350 can mechanically connect the first PCB 342 and the second PCB 344 to each other.

The PCB connector 350 may include a connector body 351 on which the first PCB 342 and the second PCB 344 may be mounted.

The connector body 351 may be formed in a plate shape. The PCB connector 350 may further include one or more spacers 352 for maintaining the first PCB 342 and the second PCB 344 spaced apart from each other.

The spacers 352 may protrude downward from the bottom 351a of the connector body 351.

A coupling protrusion 353 for coupling the first PCB 342 and the second PCB 344 may be formed on both sides of each of the spacers 352. Further, protrusion coupling portions 346 and 347 for coupling the coupling protrusions 353 may be formed at the PCBs 342 and 344. The protrusion coupling portions 346 and 347 may be grooves or holes.

In this specification, the PCB connector 350 and the main PCB 341 combined with each other may be called as a main PCB assembly.

The width of the spacers 352 may be smaller than the width of the connector body 351 so that the connector body 351 can be seated on the tops of the first PCB 342 and the second PCB 344 when the coupling protrusions 353 of the PCB connector 350 are fitted in the protrusion coupling portions 346 and 347 of the PCBs 342 and 344.

Further, the spacers 352 may be spaced apart from the lateral sides 351b and 351c of the connector body 351.

When the connector body 351 is seated on the tops of the first PCB 342 and the second PCB 344, with the coupling protrusions 353 of the PCB connector 350 fitted in the protrusion coupling portions 346 and 347 of the PCBs 342 and 344, the height of the main PCB unit 340 can be reduced.

The connector body 351 may be spaced apart from the tops of the first PCB 342 and the second PCB 344, with the coupling protrusions 353 of the PCB connector 350 fitted in the protrusion coupling portions 346 and 347 of the PCBs 342 and 344.

Further, when the spacers 352 are spaced apart from the lateral sides 351b and 351c of the connector body 351, the width of the main PCB unit 340 can be reduced with the coupling protrusions 353 of the PCB connector 350 fitted in the protrusion coupling portions 346 of the PCBs 342 and 344.

When the PCB connector 350 has the spacers 352, the spacers 352 may be spaced apart from each other in the longitudinal direction of the connector body 351.

The PCB connector 350 may include a coupling hook 357 for coupling the handle body 332.

The coupling hook 357 may horizontally extend from the connector body 351.

A reinforcing rib 354 may be formed on the bottom 351a of the connector body 351 to prevent damage to the coupling hook 357 when the PCB connector 350 and the handle body 332 are coupled by the coupling hook 357.

Though not limited, the reinforcing rib 354 may protrude from the bottom 351a of the connector body 351 and may connect the coupling hook 357 and one or more of the spacers 352 to each other.

If the PCB connector 350 has a plurality of spacers 352, the reinforcing rib 354 may connect the coupling hook 357 and the spacer 352, which is closest to the coupling hook 357 of the spacers 352, to each other.

A light emitting unit 370 for displaying the state of the cleaner 1 may be disposed on any one of the first PCB 342 and the second PCB 344.

For example, the light emitting unit 370 is disposed on the second PCB 344 in FIG. 11. The light emitting unit 370 may include one or more LEDs. For example, in FIG. 11, the light emitting unit 370 includes a plurality of LEDs 371, 372, and 373 spaced apart from each other in the longitudinal direction of the connector body 351.

Though not limited, it is possible to display the remaining capacity of the battery 40 and the intensity of the suction force of the suction motor 20, using the LEDs 371, 372, and 373.

The connector body 351 may include a plurality of light holes 355 for passing the light from the LEDs 371, 372, and 373.

The light holes 355 may be spaced apart from each other in the longitudinal direction of the connector body 351, and when the PCB connector 350 is coupled to the PCBs 342 and 344, the light holes 355 can be aligned with the LEDs 371, 372, and 373.

The spacers 352 are each positioned between two adjacent light holes 355 not to interfere with the light from the LEDs 371, 372, and 373.

According to this configuration, the spacers 352 do not interfere with the light from the LEDs 371, 372, and 373 and also each prevent interference between the light from adjacent two LEDs. That is, the spacers 352 each separate the paths of the light from two adjacent LEDs.

The PCBs 342 and 344 may include extensions 343 and 345, respectively, for supporting a power PCB 380. The extensions 343 and 345 may include inclined surfaces 343a and 345a, respectively, for supporting at an angle the power PCB 380.

A first connection terminal 349 that is connected to the power PCB 380 may be disposed on any one of the first PCB 342 and the second PCB 344.

For example, the first connection terminal 349 is disposed on a first extension 343 of the first PCB 342 in FIG. 11.

Any one of the first PCB 342 and the second PCB 344 may be connected to the connector 400 in the main body 20.

In the following description, it is exemplified that the connector 400 is connected to the second PCB 344.

The main PCB unit 340 may further include a PCB cover 360 that covers upper portions of the PCBs 342 and 344 and the PCB connector 350.

The PCB cover 360 may include a top portion 361 covering the top of the PCB connector 350 and a pair of side portions 362 and 363 extending downward from both sides of the top portion 361.

The side portions 362 and 363 can cover not only the PCB connector 350, but a portion of the upper portions of the PCBs 342 and 344.

The side portions 362 and 363 can prevent the PCBs 342 and 344 coupled to the PCB connector 350 from horizontally moving in the handle 30.

The PCB cover 360 covers the light holes 355 of the connector body 351. The PCB cover 360 may include a plurality of light transmissive portions 364 so that the light passing through the light holes 355 can pass through the PCB cover 360. The light transmissive portions 364 are the same in number as the light holes 355 and face the light holes 355.

The light transmissive portions 364 may protrude upward from the top portion 361 of the PCB cover 360.

At least the light transmissive portions 364 of the PCB cover 360 may the transparent or translucent.

Meanwhile, the second PCB 344 may have a plurality of contact pads for electrical connection with the connector.

The contact pads may be disposed on both sides of the second PCB 344.

The contact pads may include one or more first pads 3442 on a first side 3440a of the second PCB 344 and a second pad 3444 spaced from the first pads 3442. For example, the first pads 3442 and the second pad 3444 are horizontally spaced apart from each other.

The contact pads may further include one or more third pads 3443 on a second side 3440b that is the opposite side to the first side 3440a and a fourth pad 3445 spaced from the third pads 3443. For example, the third pads 3443 and the fourth pad 3445 are horizontally spaced apart from each other.

On the second PCB 344, the first pads 3442 and the third pads 3443 face with each other and, the second pad 3444 and the fourth pad 3445 face with each other.

The second PCB 344 may have a slit 3441 for coupling the second PCB 344 and the connector in position.

The slit 3441 is disposed between the first pads 3442 and the second pad 3444. Accordingly, the slit 3441 is disposed also between the third pads 3443 and the fourth pad 3445. The slit 3441 may be formed by cutting an end portion, where the pads are disposed, of the second PCB 344.

Figure 13:
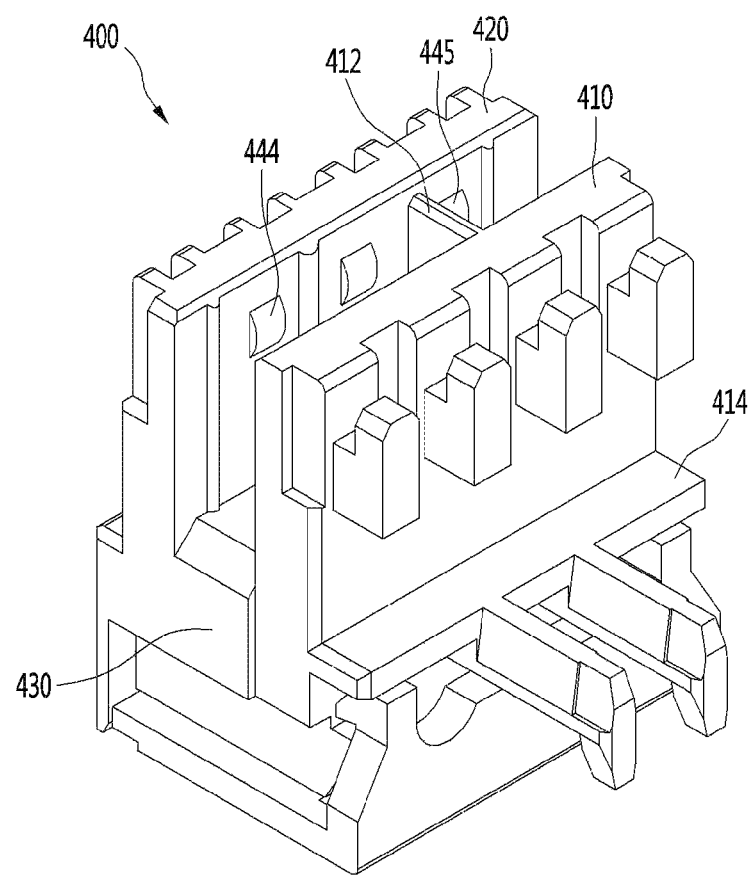
FIG. 13 is a perspective view of a connector according to an embodiment of the present invention.
Figure 14:
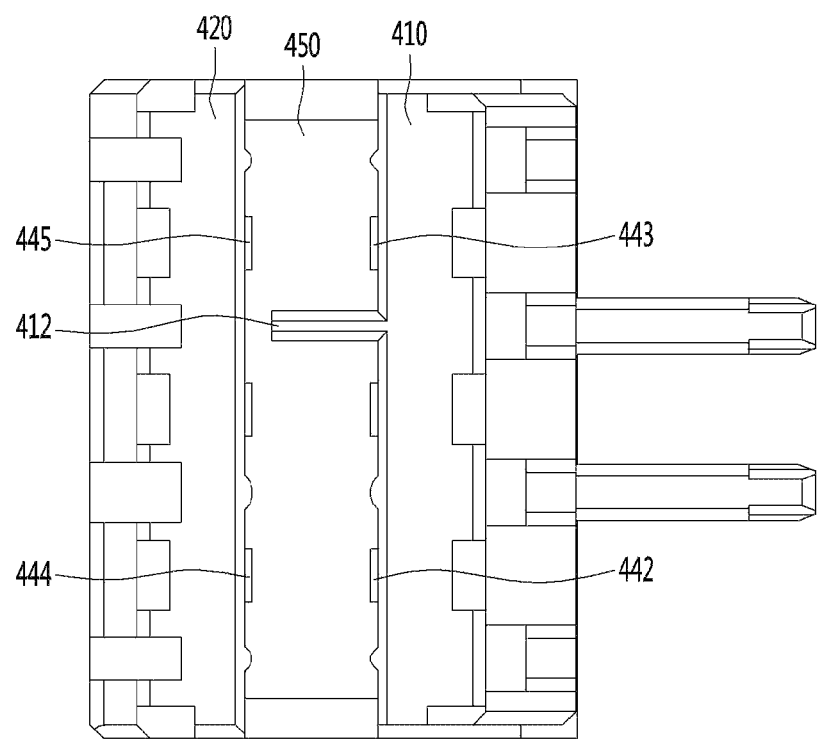
FIG. 14 is a plan view of the connector shown in FIG. 13.
Figure 15:
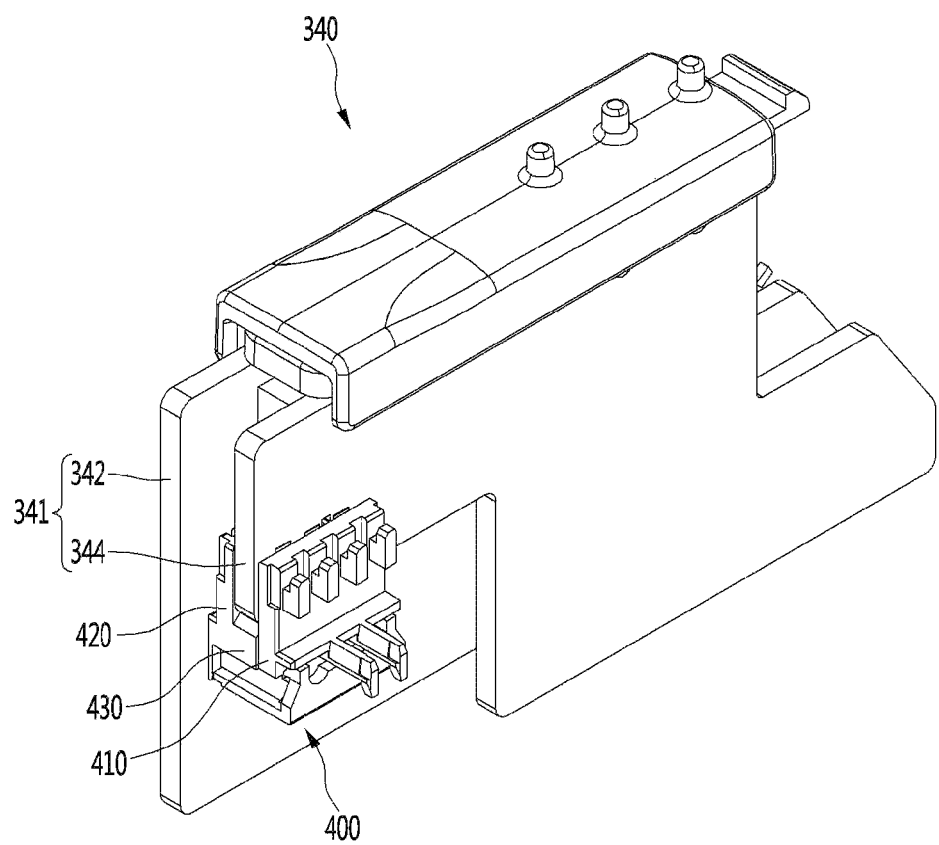
FIG. 15 is a perspective view showing a state in which the main PCB unit is connected to the connector.
Figure 16:
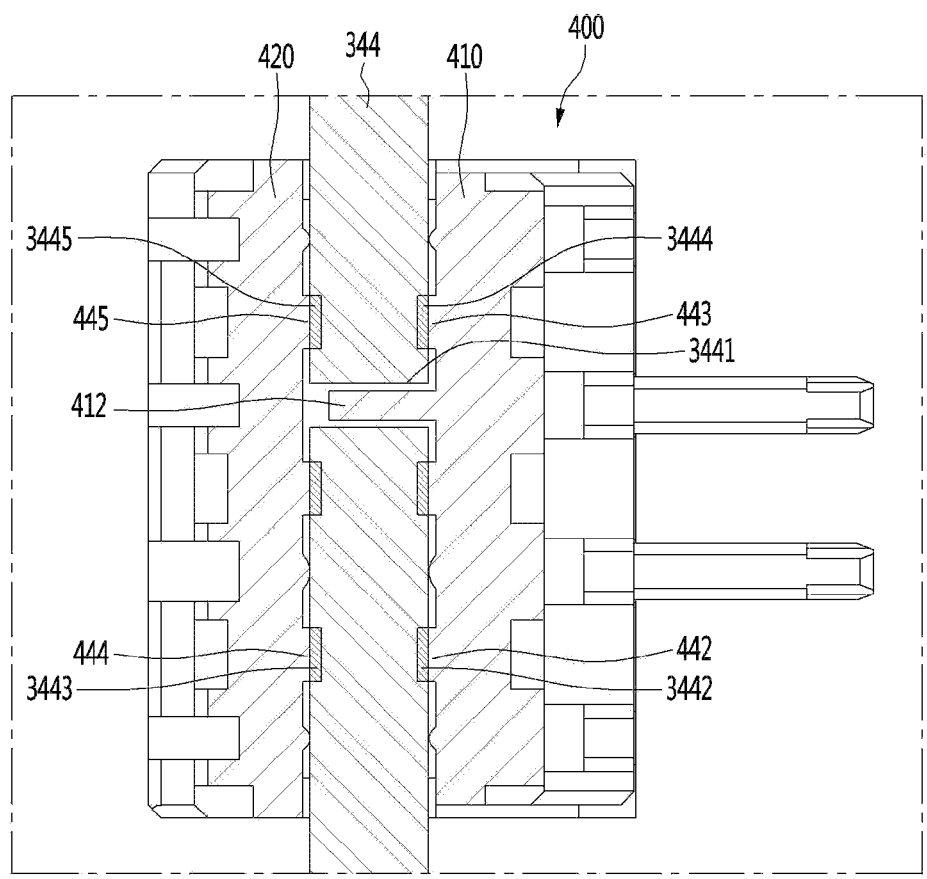
FIG. 16 is a cross-sectional view showing a second PCB and the connector that have been coupled.

FIG. 13 is a perspective view of the connector according to an embodiment of the present invention, FIG. 14 is a plan view of the connector shown in FIG. 13, FIG. 15 is a perspective view showing the main PCB unit and the connector that have been coupled, and FIG. 16 is a cross-sectional view showing the second PCB and the connector that have been coupled.

Referring to FIGS. 13 and 16, the connector 400 of this embodiment may have a first connecting body 410, a second connecting body 420 spaced apart from the first connecting body 410, and a bridge body 430 connecting the first connecting body 410 and the second connecting body 420 to each other.

The bridge body 430 may connect the first connecting body 410 and the lower portion of the second connecting body 420 to each other so that the second PCB 344 can be coupled to the connector 400 from above the connector 400.

Accordingly, a PCB receiving space 450 for receiving the second PCB 344 is defined between the first connecting body 410 and the second connecting body 420.

One or more first connecting pins 442 and a second connecting pin 443 spaced apart from the first connecting pins 442 may be disposed on the side, which faces the second connecting body 420, of the first connecting body 410. The first connecting pins 442 and the second connecting pin 443 may be horizontally spaced apart from each other.

One or more third connecting pins 444 and a fourth connecting pin 445 spaced from the first connecting pins 444 may be disposed on the side, which faces the first connecting body 410, of the second connecting body 420. The third connecting pins 444 and the fourth connecting pin 443 may be horizontally spaced apart from each other.

The first connecting pins 442 and the third connecting pins 444 may be spaced from and face each other. The second connecting pin 443 and the fourth connecting pin 444 may be spaced from and face each other.

Some of the connecting pins 442 to 445 may be disposed inside the connecting bodies 410 and 420, respectively, and the others may protrude toward the PCB receiving space 450 from the connecting bodies 410 and 420.

The connecting pins 442 to 445, for example, may be elastically deformable conductors, so the connecting pins 442 to 445 protruding from the connecting bodies 410 and 420, respectively, may be pressed inside the connecting bodies 410 and 420, respectively, by external force.

Alternatively, the connecting pins 442 to 445 may be conductor and fixed to the connecting bodies 410 and 420, respectively.

A slit insertion protrusion 412 that is inserted in the slit 3441 of the second PCB 344 may be formed on the PCB receiving space 450.

The slit insertion protrusion 412 may be disposed between the first connecting pins 442 and the second connecting pin 443. Accordingly, the slit insertion protrusion 412 is disposed also between the third connecting pins 444 and the fourth connecting pin 445.

The slit insertion protrusion 412 may protruded to the PCB receiving space 450 from the bridge body 430. For example, the slit insertion protrusion 412 may protrude upward from the bridge body 430.

Alternatively, the slit insertion protrusion 412 may be formed on any one of the connecting bodies 410 and 420 and protrude toward the other one. Alternatively, the slit insertion protrusion 412 may connect the first connecting body 410 and the second connecting body 420 to each other.

A protrusion seat 414 on which the stopper rib 136a described with reference to FIG. 6 is seated may be formed on any one of the first connecting body 410 and the second connecting body 420. FIG. 13 shows an example in which the protrusion 414 is formed on the first connecting body 410.

On the other hand, the second PCB 344 may be inserted into the PCB receiving space 450 from above the connecting body 400.

When the second PCB 344 is inserted into the PCB receiving space 450, the slit insertion protrusion 412 can be inserted into the slit 3441 of the second PCB 344.

When the slit insertion protrusion 412 is inserted in the slit 3441 of the second PCB 344, the second PCB 344 is normally connected to the connector 400.

In this state, the pads 3442 to 3445 are in contact with the connecting pins 442 to 445, respectively, in position.

According to the present invention, when the slit insertion protrusion 412 is inserted in the slit 3441 of the second PCB 344, the pads 3442 to 3445 are in contact with the connecting pins 442 to 445, misassembly of the second PCB 344 and the connector 400 is prevented.

Further, as misassembly of the second PCB 344 and the connector 400 is prevented, a short circuit due to connection of two adjacent pads through a connecting pin can be prevented.

According to the present invention, since the second PCB 344 is inserted between the two connecting bodies 410 and 420 and the slit insertion protrusion 412 is inserted in the slit 3441 of the second PCB 344, there is no need for an additional fixing member such as a hook for fixing the second PCB 344 and the connector 400.

Further, in the present invention, the first connecting pins 422 and the third connecting pins 444 have the same function, and the second connecting pin 443 and the fourth connecting pin 445 have the same function.

Further, on the second PCB 344, the first pads 3442 and the third pads 3443 have the same function, and the second pad 3444 and the fourth pad 3445 has the same function.

Accordingly, since the pads 3442 to 3445 are disposed on both sides of the second PCB 344 and the second PCB 344 is inserted between the two connecting bodies 410 and 420, signals can be transmitted as long as the pads 3442 to 3445 on one of both sides of the second PCB 344 are connected to the connecting pins 442 to 445, so the second PCB 344 and the connector 400 can be more accurately connected.

It may be possible to form a wedge on the slit insertion protrusion 412 and form an additional groove on the slit 3441 to receive the wedge in order to more firmly combine the second PCB 344 and the connector 400.

Figure 17:
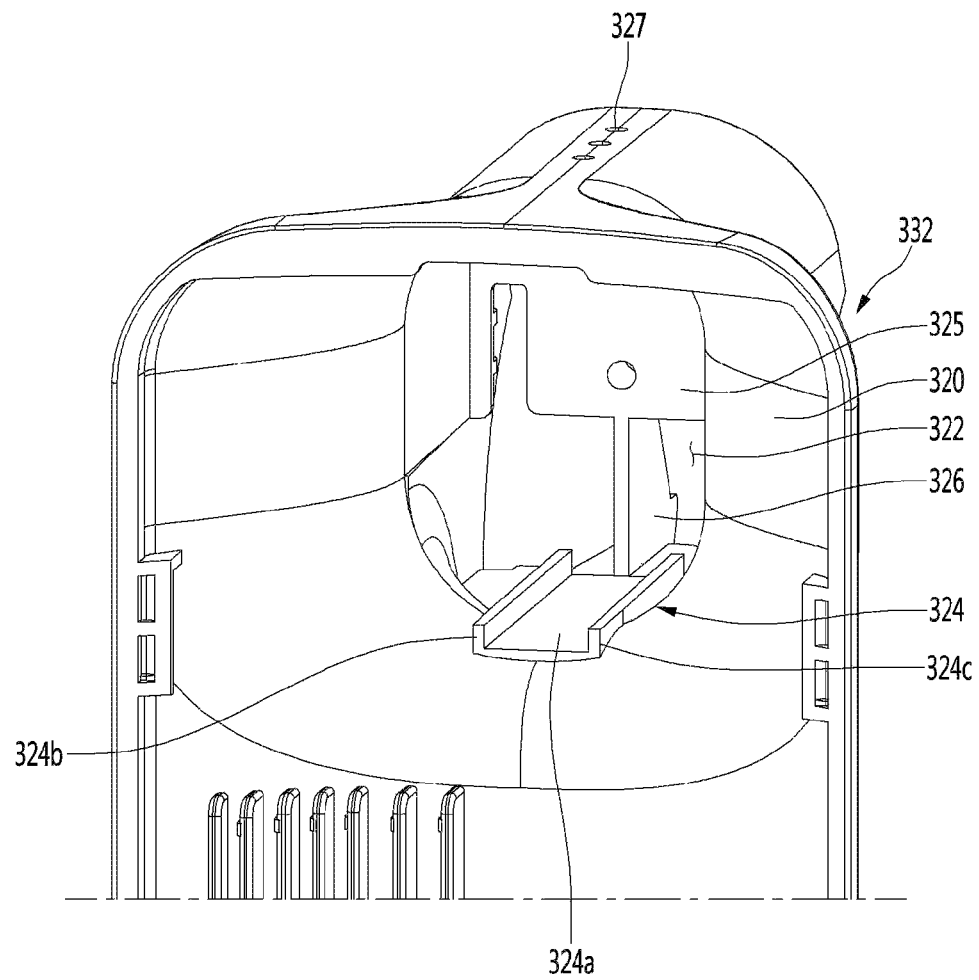
FIG. 17 is a perspective view of a handle body according to an embodiment of the present invention.
Figure 18:
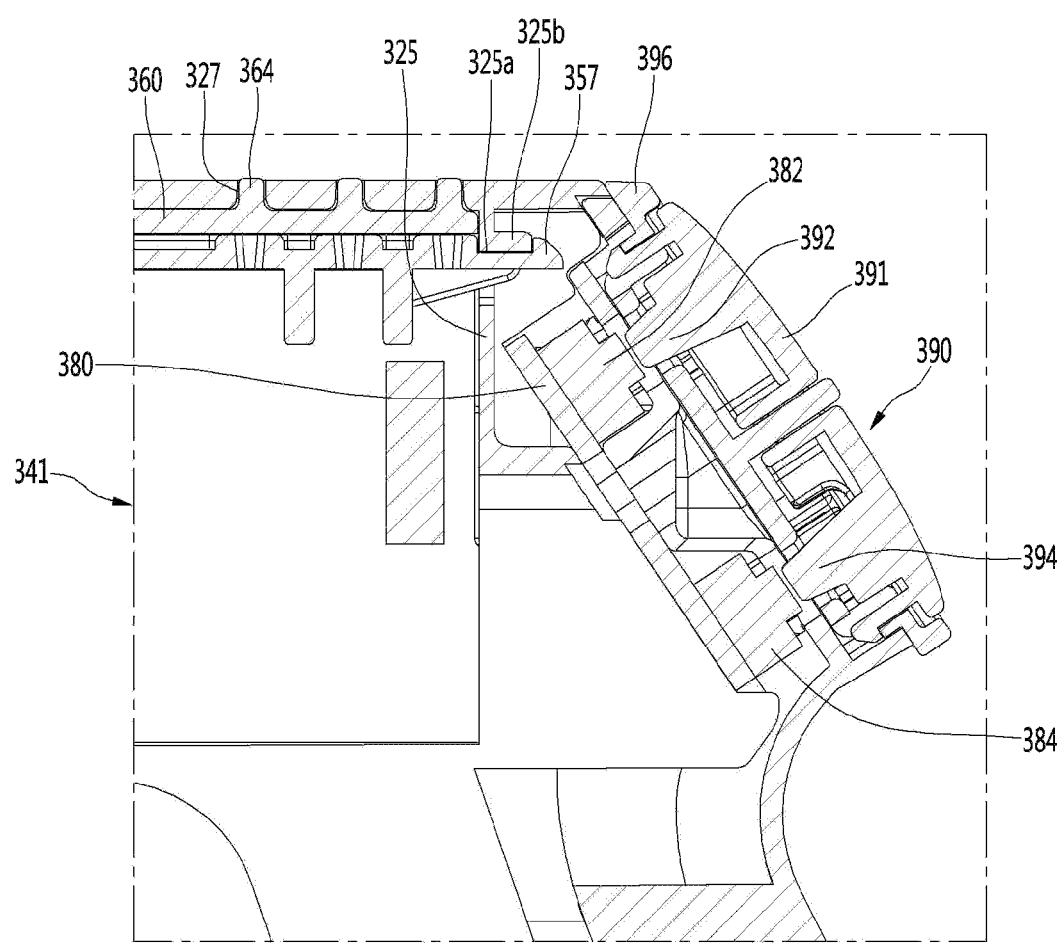
FIG. 18 is a cross-sectional view showing the internal structure of a handle.
Figure 19:
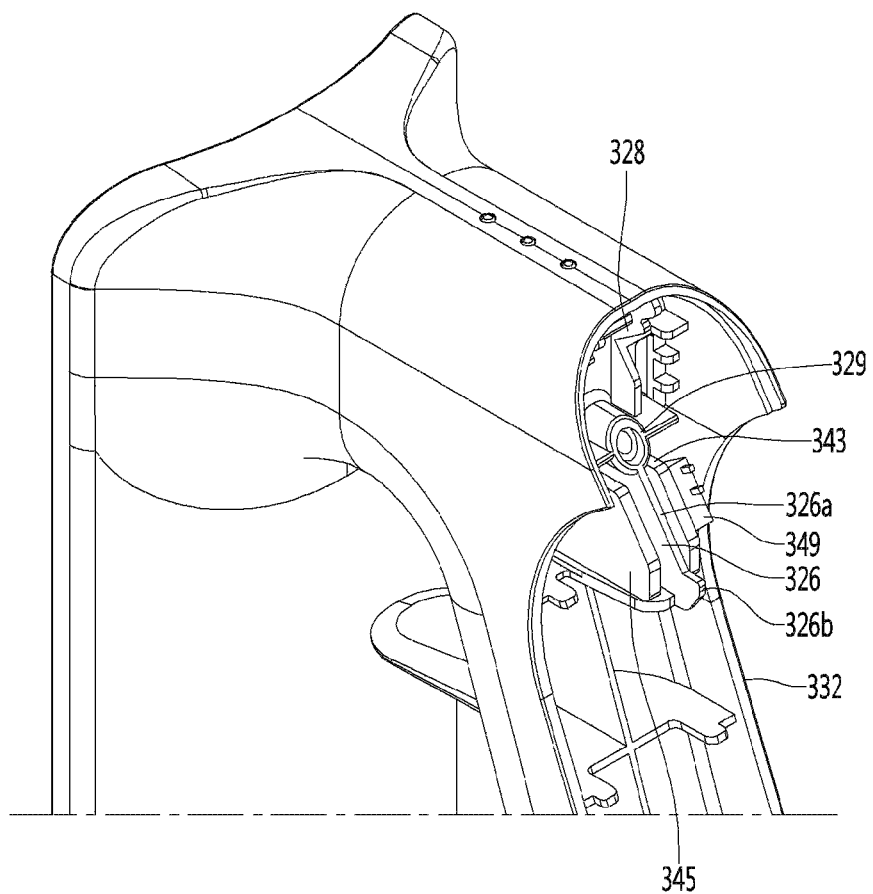
FIG. 19 is a cross-sectional view after the main PCB unit is coupled to the handle body.
Figure 20:
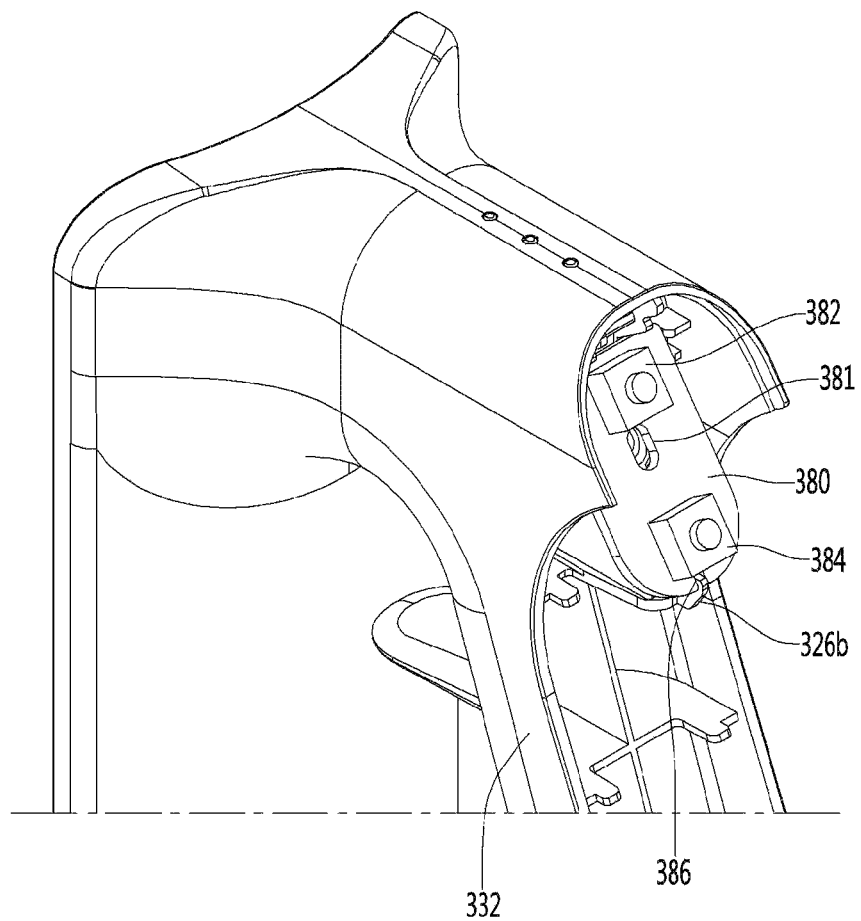
FIG. 20 is a view after a power PCB is seated on a support rib, with the main PCB unit coupled to the handle body.
Figure 21:
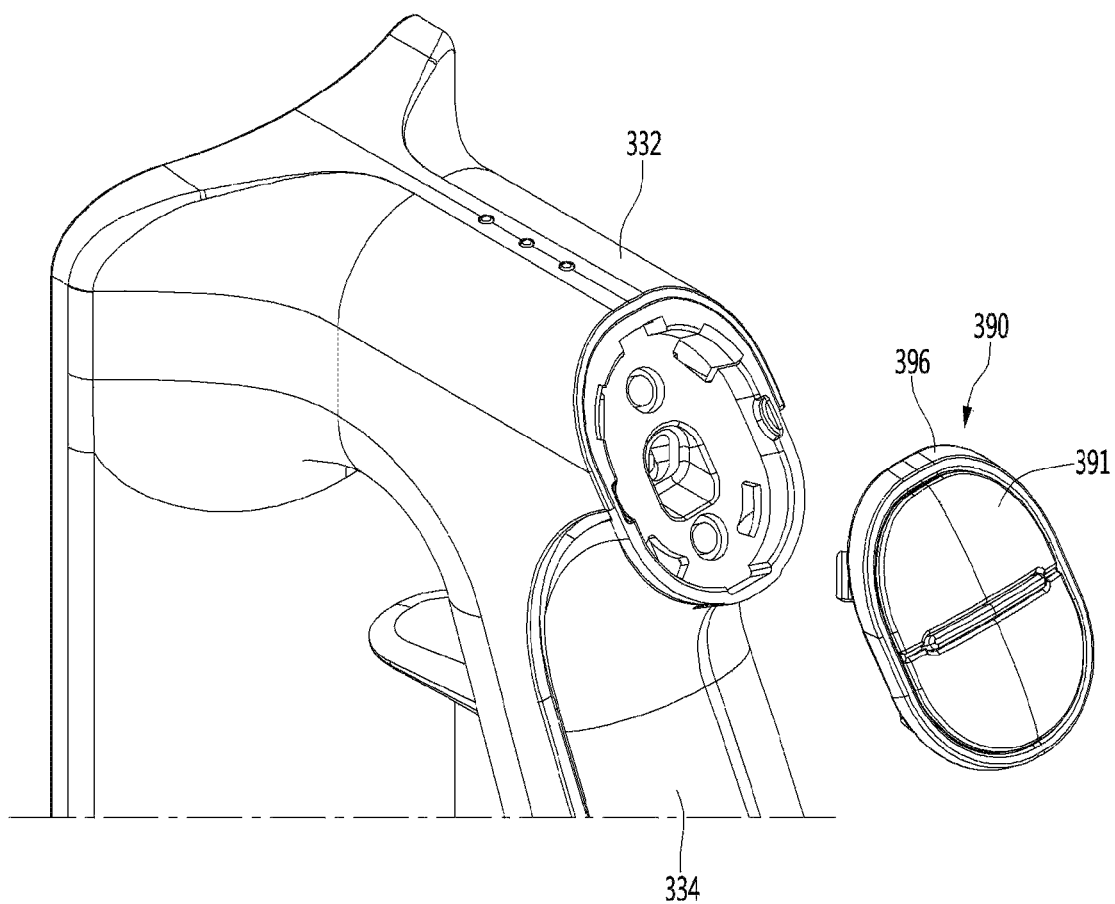
FIG. 21 is a view when a handle cover and an operation unit are combined in the state shown in FIG. 20.

FIG. 17 is a perspective view of the handle body according to an embodiment of the present invention, FIG. 18 is a cross-sectional view showing the internal structure of a handle according to an embodiment of the present invention, FIG. 19 is a cross-sectional view when the main PCB unit is coupled to the handle body according to an embodiment of the present invention, FIG. 20 is a view showing the power PCB seated on the support rib with the main PCB unit coupled to the handle body, and FIG. 21 is a view when the handle cover and the operation unit are combined in the state shown in FIG. 20.

Figure 22:
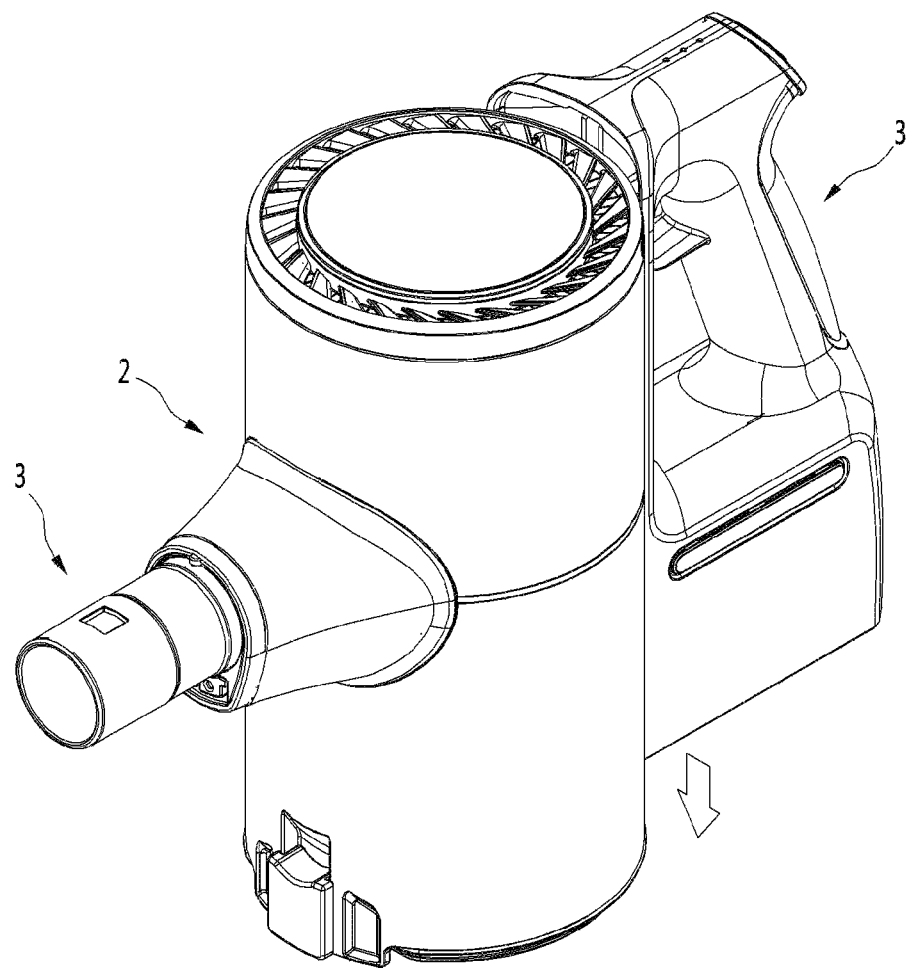
FIG. 22 is a view when the handle part according to an embodiment of the present invention is coupled to the main body after being assembled.

FIG. 22 is a view when the handle part according to an embodiment of the present invention is coupled to the main body after being assembled.

Referring to FIGS. 8 to 22, a space 322 for receiving the main PCB unit 340 may be defined in the handle body 332. The space 322 is a space substantially defined in the second extension 320.

The handle body 332 may include a support 324 that supports the main PCB unit 340.

The support 324 may include a seat 324a on which the main PCB unit 340 is seated, a first rib 324b that supports the first PCB 342 on the seat 324a, and a second rib 324c that supports the second PCB 344 on the seat 324a.

The ribs 324b and 324c may protrude upward from the seat 324a.

The main PCB unit 340 on the support 324 cannot be moved left and right in FIG. 16 by the first rib 324b and the second rib 324c.

Further, the first rib 324b and the second rib 324c guide the main PCB assembly that is inserted into the space 322 of the handle body 332.

The handle body 332 may further include a plurality of insertion holes 364 for inserting the light transmissive portions 364 of the PCB cover 360.

When being inserted in the insertion holes 327, the light transmissive portions 364 may be exposed to the outside of the handle 30. Accordingly, a user can visually check the light from the LEDs 371, 372, and 373 through the light transmissive portions 364.

In this embodiment, since the light transmissive portions 364 are inserted in the insertion holes 327, it is possible to prevent external moisture or dirt from flowing to the main PCB 341 through the insertion holes 327.

The handle body 332 may further include a connector coupling portion 325 to which the PCB connector 350 is coupled when the main PCB assembly is inserted into the space 322.

The connector coupling portion 325 may include a hole 325a for passing the coupling hook 357 of the PCB connector 350 and a hook locking rib 325b for locking the coupling hook 357 that has passed through the hole 325a.

Meanwhile, the power PCB 380 may include a first switch 382 and a second switch 384 for receiving operation instructions from the operation unit 390. Though not limited, the first switch 382 may receive instructions to turn on/off the suction motor 20 and the second switch 384 may receive instructions to control the intensity of the suction force of the suction motor 20.

The handle body 332 may further include a support rib 326 for supporting the power PCB 380. The support rib 326 may extend downward from the connector coupling portion 325.

The support rib 326 may include an inclined surface 326a so that the power PCB 380 can be positioned at an angle. Accordingly, when the power PCB 380 is supported by the inclined surface 326a, the first switch 382 and the second switch 384 are at different heights.

When the main PCB unit 340 is coupled to the handle body 332, the support rib 326 is positioned between the first PCB 342 and the second PCB 344. The support rib 326 is spaced apart from the first PCB 342 and the second PCB 344 in order not to damage the main PCB 341 when the main PCB unit 340 is coupled.

The inclination angle of the inclined surface 326a of the support rib 326 may be the same as the inclination angles 343a and 345a of the extensions 343 and 345 of the PCBs 342 and 344.

Accordingly, the inclined surfaces 343a and 345a of the PCBs 342 and 344 and the inclined surface 326a of the support rib 326 can support the power PCB 380.

Obviously, the inclined surfaces 343a and 345a of the PCBs 342 and 344 may be spaced apart from the power PCB 380, with the power PCB 380 in contact with the inclined surface 326a of the support rib 326.

The handle body 332 may further include a fitting rib 326b passing through the power PCB 380 to prevent the power PCB 380 being in contact with the inclined surface 326a of the support rib 326 from moving left and right in FIG. 15. Further, a slit 386 for passing the fitting rib 326b may be formed in the power PCB 380.

The fitting rib 326b may be formed at the lower portion of the support rib 326. When the power PCB 380 is seated on the inclined surface 326a of the support rib 326, the fitting rib 326b is fitted in the slit 386, so it is possible to prevent the power PCB 380 from sliding down on the inclined surface 326a of the support rib 326 in the process of assembling the power PCB 380.

The handle body 332 may further include a top stopper 328 for preventing the power PCB 380 on the support rib 326 from moving up.

The handle body 332 may further include a fastening boss 329 for fastening the power PCB 380 on the support rib 326 using a fastener (not shown) such as a screw.

A hole 381 for passing the fastener may be formed through the power PCB 380.

On the other hand, the operation unit 390 may include a support frame 396 for coupling to the handle cover 334 and an operation button 391 combined with the support frame 396.

The operation button 391 may include a first pushing portion 392 for pressing the first switch 382 and a second pushing portion 394 for pressing the second switch 384. That is, one operation button 391 may include two pushing portions 392 and 394.

According to the present invention, since the power PCB 380 is inclined with the first switch 382 and the second switch 384 at different heights, a user can hold the handle 30 and press the first switch 382 or the second switch 384 by operating the operation button 391 with one finger. Accordingly, the user can more conveniently operate the cleaner.

A process of assembling the main PCB unit 340 and the power PCB 380 is described hereafter.

First, the PCB cover 360 is inserted into the space 322 of the handle body 332 such that the light transmissive portions 364 of the PCB cover 360 are inserted into the insertion holes 327 of the handle body 332.

The main PCB assembly is completed by connecting the first PCB 342 and the second PCB 344 through the PCB connector 350 and then the main PCB assembly is inserted into the space between the PCB cover 360 and the support 324 of the handle body 332.

When the main PCB assembly is inserted, the side portions 362 and 363 of the PCB cover 360 and the first and second ribs 324b and 324c of the support 324 guide the main PCB assembly.

When the coupling hook 357 of the PCB connector 350 is locked to the hook locking rib 325b through the hook hole 325a while the main PCB assembly is inserted into the space 322 of the handle body 332, coupling of the main PCB assembly is completed.

In this state, as in FIG. 20, the power PCB 380 is seated on the support rib 326 and then the power PCB 380 may be fixed to the handle body 332 by a fastener.

The power PCB 380 is fixed to the handle body 332 substantially at the same height as the main PCB 341.

Next, as in FIG. 21, the handle cover 334 is coupled to the handle body 332 and then the operation unit 390 may be coupled to the second handle body 334.

Further, as in FIG. 22, it is possible to fix the handle part 3 to the main body 2 by aligning the handle part 3 with the main body 2 and then sliding down the handle part 3.

Also, the main PCB is divided into two PCBs and inserted in the handle body, and the size of the main PCB can be reduced.

In particular, the two PCBs are erect in parallel with each other and inserted in the handle body, the size of the main PCB unit 340 can be minimized.

Further, since the main PCB assembly can be coupled to the handle body while it is inserted into the space of the handle body with the two PCBs connected to the PCB connector, the structures for fixing the two PCBs to each other and fixing the two PCBs to the handle body are simple and a user can easily assemble them.

Further, since the second PCB is connected to the connector when the handle part is slid on the main body, there is no need for a process of connecting the second PCB to the connector.

The invention claimed is:

1. A cleaner comprising:
a main body comprising:
a suction motor configured to generate suction force, and
a dust separator configured to separate dust from air using a cyclone flow, wherein the dust separator and the suction motor are arranged in a first direction parallel to an axis of the cyclonic flow;
a Printed Circuit Board (PCB) configured to generate a control command of the suction motor;
a handle part that accommodates the PCB and that is configured to couple to the main body in the first direction; and
a connector located at the main body,
wherein the PCB is configured to couple to the connector based on the handle part moving along an outer surface of the main body in the first direction.

2. The cleaner of claim 1, wherein the axis of the cyclonic flow extends in a vertical direction.

3. The cleaner of claim 1, wherein the main body comprises a suction unit configured to guide air containing dust into the dust separator, and
the connector is positioned higher than the suction unit.

4. The cleaner of claim 1, wherein the main body comprises a connector support configured to support the connector.

5. The cleaner of claim 4, wherein the main body further comprises a stopper rib for preventing the connector supported by the connector support from separating upward.

6. The cleaner of claim 5, wherein the stopper rib is spaced from the connector support, and the connector is inserted in a space between the connector support and the stopper rib.

7. The cleaner of claim 5, wherein the connector is horizontally slid on the connector support.

8. The cleaner of claim 1, wherein the connector comprises:
first and second connecting bodies spaced apart from each other;
a bridge body configured to connect a lower side of the first connecting body to a lower side of the second connecting body; and
a PCB receiving space defined between the first connecting body and the second connecting body.

9. The cleaner of claim 8, wherein the PCB comprises a first PCB and a second PCB, and
wherein one of the first PCB or the second PCB is received in the PCB receiving space.

10. The cleaner of claim 9, wherein the first and second connecting bodies are arranged in a second direction, and
wherein the first PCB and the second PCB are arranged in the second direction.

11. The cleaner of claim 8, wherein first and second connecting bodies are arranged in a second direction perpendicular to the first direction.

12. The cleaner of claim 8, wherein the PCB is inserted in the PCB receiving space downward from an upper side of the PCB receiving space.

13. The cleaner of claim 1, wherein the PCB comprises a plurality of pads and a slit, and
wherein the connector comprises a plurality of connecting pins that are configured to contact the plurality of pads and a slit insertion protrusion that is configured to insert into the slit.

14. The cleaner of claim 1, wherein when the PCB is coupled to the connector, at least a portion of the connector is received in the handle part.

15. The cleaner of claim 14, wherein the handle part comprises a handle, a battery housing and a connection body that connects the handle and the battery housing, and
wherein when the PCB is coupled to the connector, the connection body surrounds the connector.

16. The cleaner of claim 1, wherein the suction motor is located above the dust separator in an orientation of the cleaner in which the axis of the cyclonic flow is arranged along a vertical direction.

* * * * *